US006639243B2

(12) United States Patent
Gonzalez et al.

(10) Patent No.: US 6,639,243 B2
(45) Date of Patent: Oct. 28, 2003

(54) DRAM CELL CONSTRUCTIONS

(75) Inventors: Fernando Gonzalez, Boise, ID (US); Kevin L. Beaman, Boise, ID (US); John T. Moore, Boise, ID (US); Ron Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/012,233

(22) Filed: Dec. 5, 2001

(65) Prior Publication Data

US 2002/0055225 A1 May 9, 2002

Related U.S. Application Data

(62) Division of application No. 09/651,484, filed on Aug. 30, 2000.

(51) Int. Cl.[7] .................. H01L 27/108; H01L 29/04; H01L 29/76; H01L 31/036; H01L 31/112
(52) U.S. Cl. .................. 257/68; 257/296; 257/347
(58) Field of Search ................. 257/68, 69, 70, 257/283, 296, 347, 401, 403, 906

(56) References Cited

U.S. PATENT DOCUMENTS

| | | | |
|---|---|---|---|
| 4,891,329 A | 1/1990 | Reisman et al. | |
| 5,298,449 A | 3/1994 | Kikuchi | |
| 5,374,564 A | 12/1994 | Bruel | |
| 5,374,581 A | 12/1994 | Ichikawa et al. | |
| 5,855,693 A | 1/1999 | Murari et al. | |
| 5,877,070 A | 3/1999 | Goesele et al. | |
| 5,882,987 A | 3/1999 | Srikrishnan | |
| 5,894,152 A | 4/1999 | Jaso et al. | |
| 5,953,622 A | 9/1999 | Lee et al. | |
| 5,998,847 A * | 12/1999 | Assaderaghi et al. | 257/401 |
| 6,004,406 A | 12/1999 | Kobayashi et al. | |
| 6,083,324 A | 7/2000 | Henley et al. | |
| 6,150,031 A | 11/2000 | Yonehara | |
| 6,245,161 B1 | 6/2001 | Henley et al. | |
| 6,251,754 B1 | 6/2001 | Ohshima et al. | |
| 6,309,945 B1 | 10/2001 | Sato et al. | |
| 6,384,439 B1 * | 5/2002 | Walker | 257/296 |
| 6,423,992 B2 * | 7/2002 | Fukuda et al. | 257/288 |
| 6,429,070 B1 * | 8/2002 | Gonzaler et al. | 438/253 |

OTHER PUBLICATIONS

"Semiconductor Wafer Bonding: Science, Technology, and Applications"; Ulrich Gosele et al.; The Electrochemical Society, Inc.; vol. 97–36; pp. iii, 408–417 & 436–445.

* cited by examiner

Primary Examiner—David Nhu
(74) Attorney, Agent, or Firm—Wells St. John P.S.

(57) ABSTRACT

The invention includes a method of forming a DRAM cell. A first substrate is formed to include first DRAM sub-structures separated from one another by an insulative material. A second semiconductor substrate having a monocrystalline material is bonded to the first substrate. After the bonding, second DRAM sub-structures are formed in electrical connection with the first DRAM sub-structures. The invention also includes a semiconductor structure which has a capacitor structure, and a first substrate defined to encompass the capacitor structure. The semiconductor structure further includes a monocrystalline silicon substrate bonded to the first substrate and over the capacitor structure. Additionally, the semiconductor structure includes a transistor gate on the monocrystalline silicon substrate and operatively connected with the capacitor structure to define a DRAM cell.

9 Claims, 31 Drawing Sheets

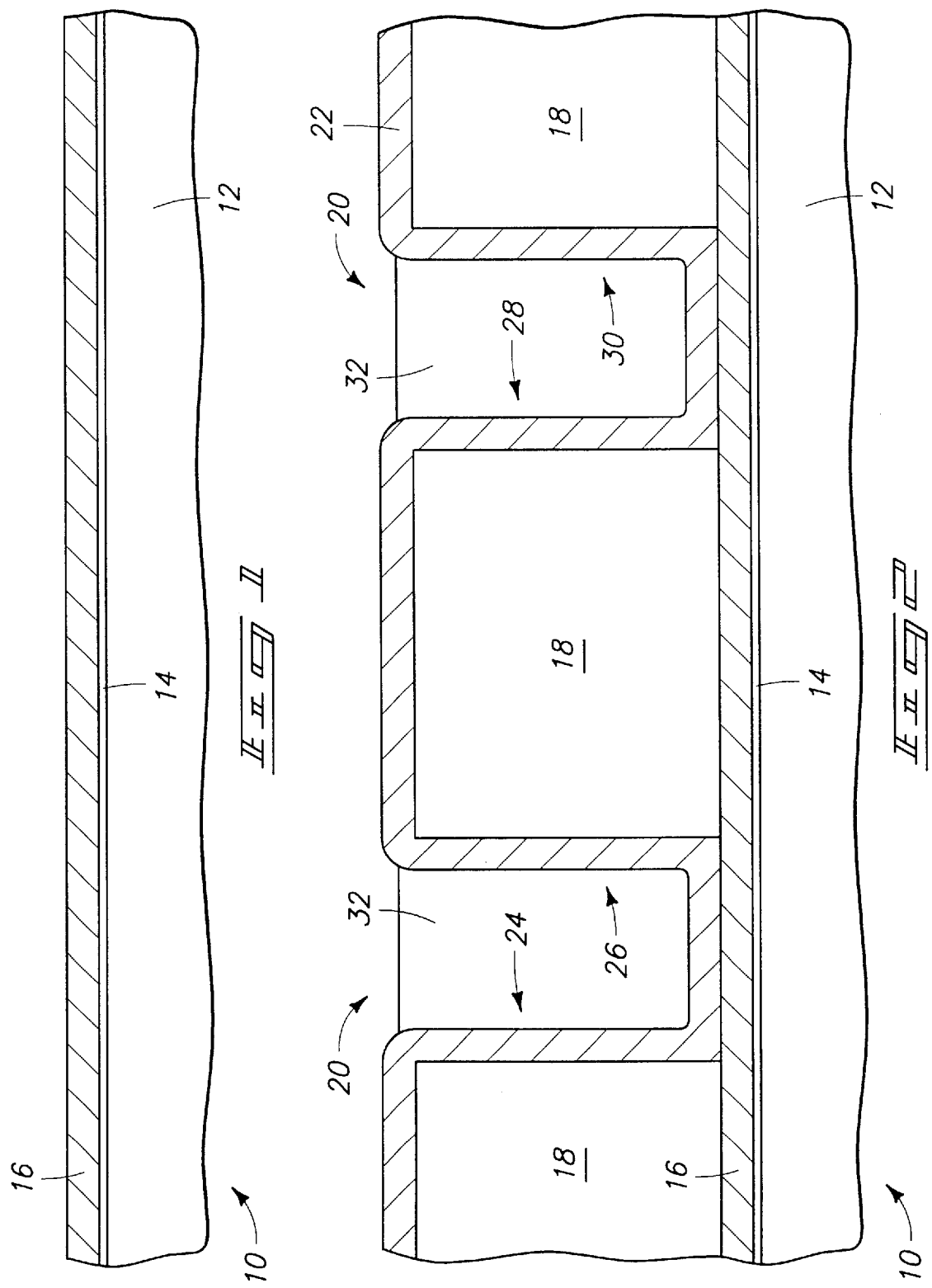

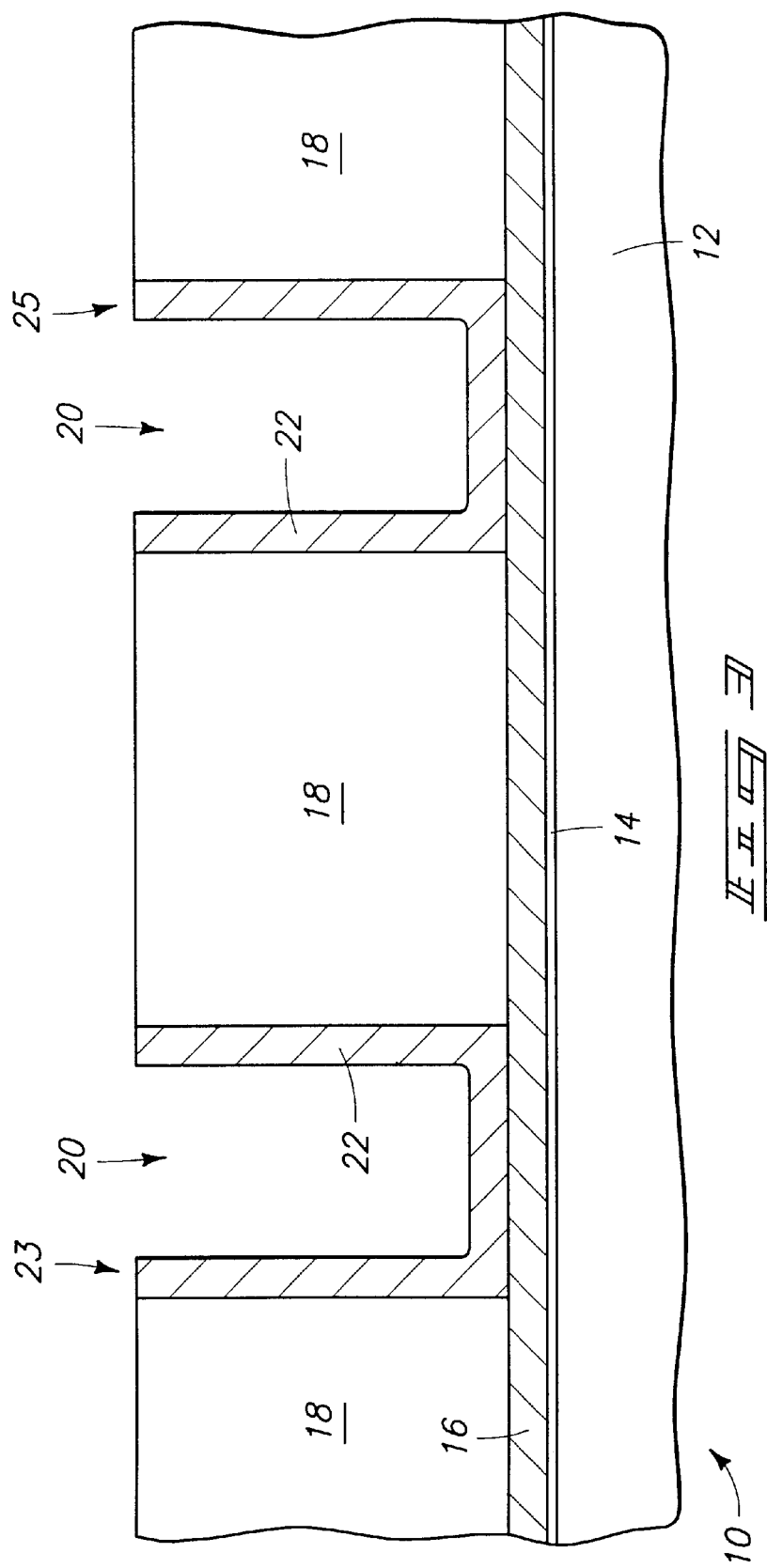

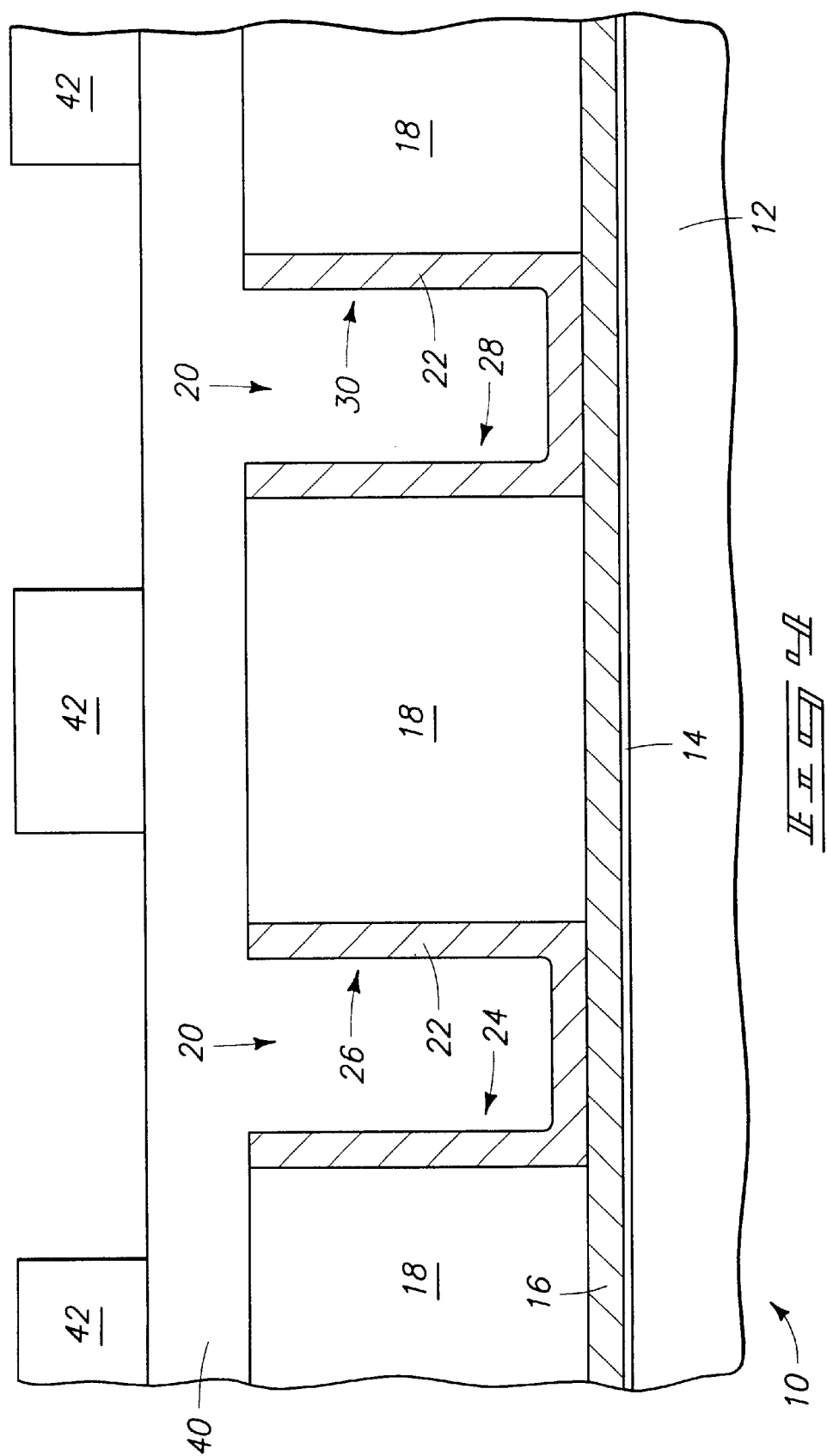

FIG. II

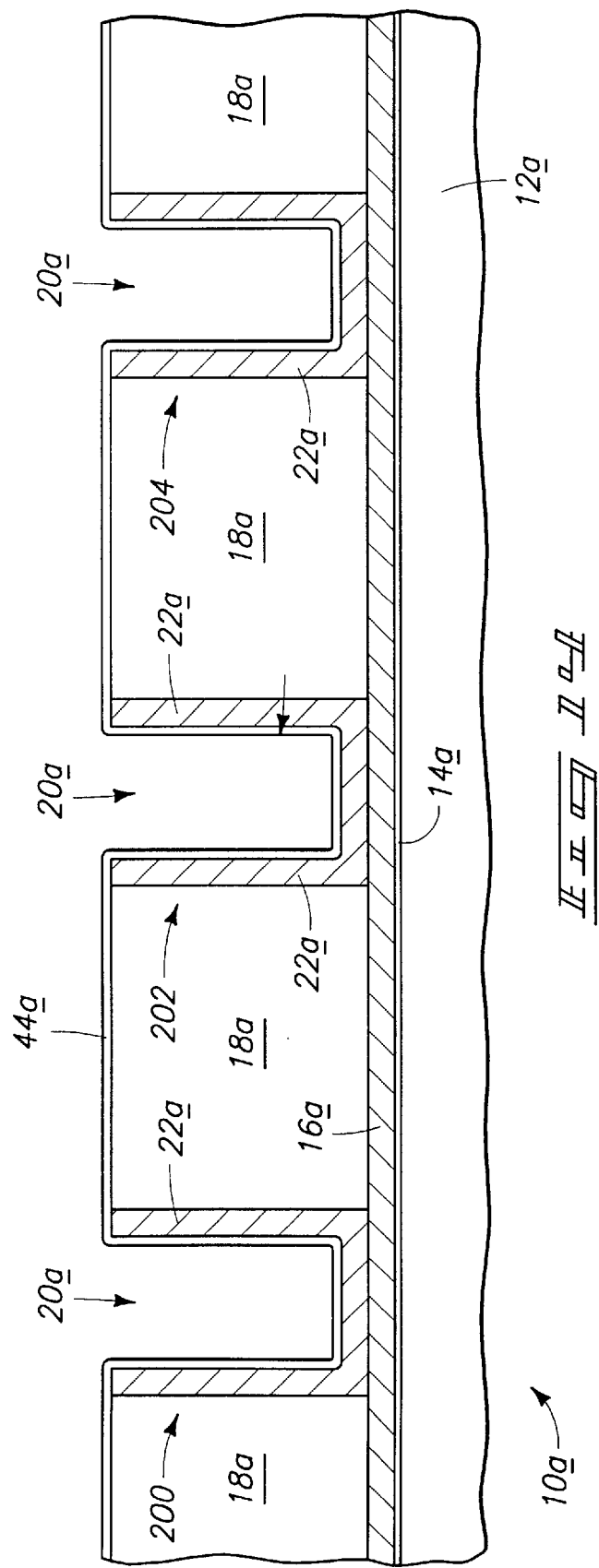

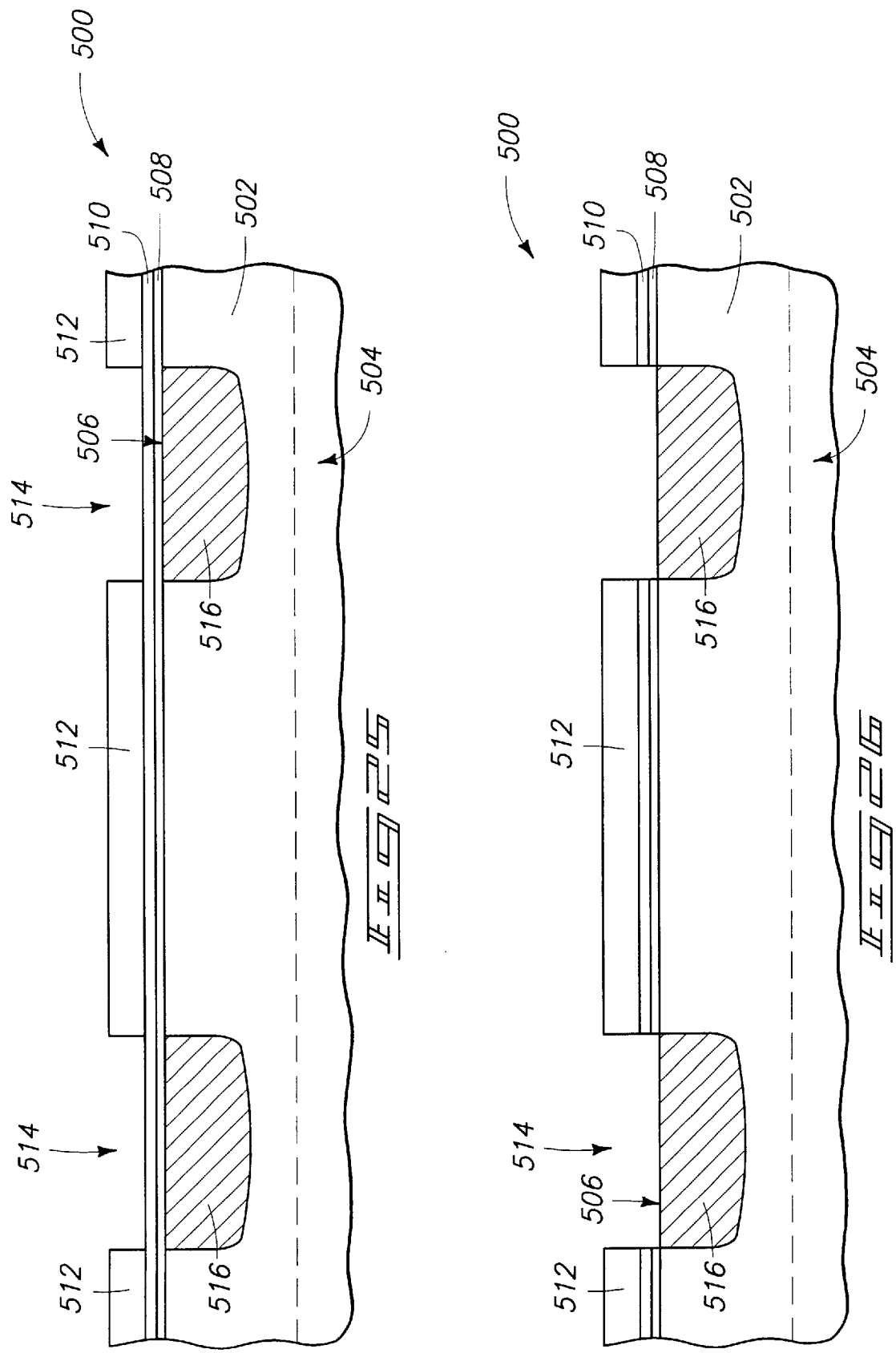

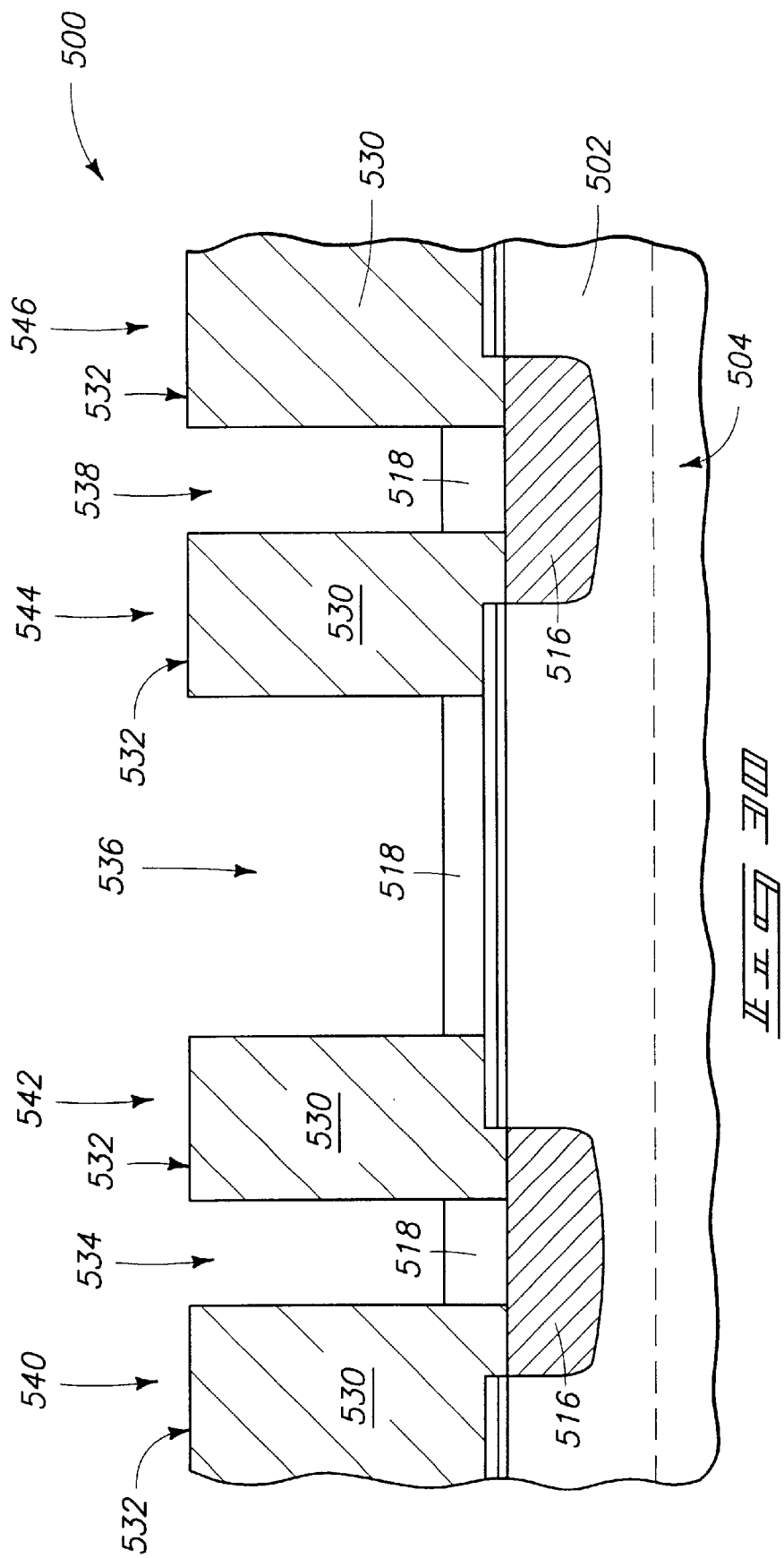

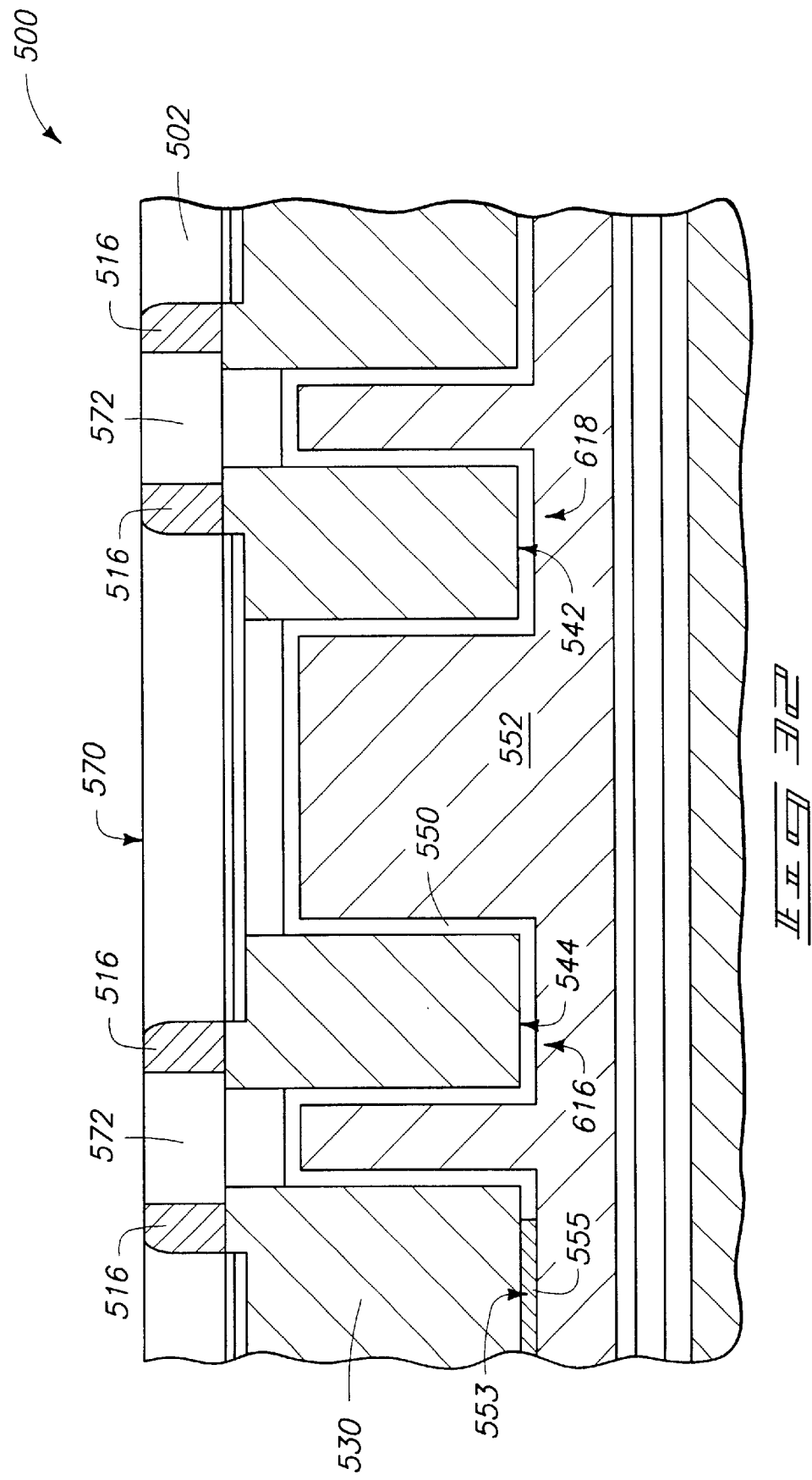

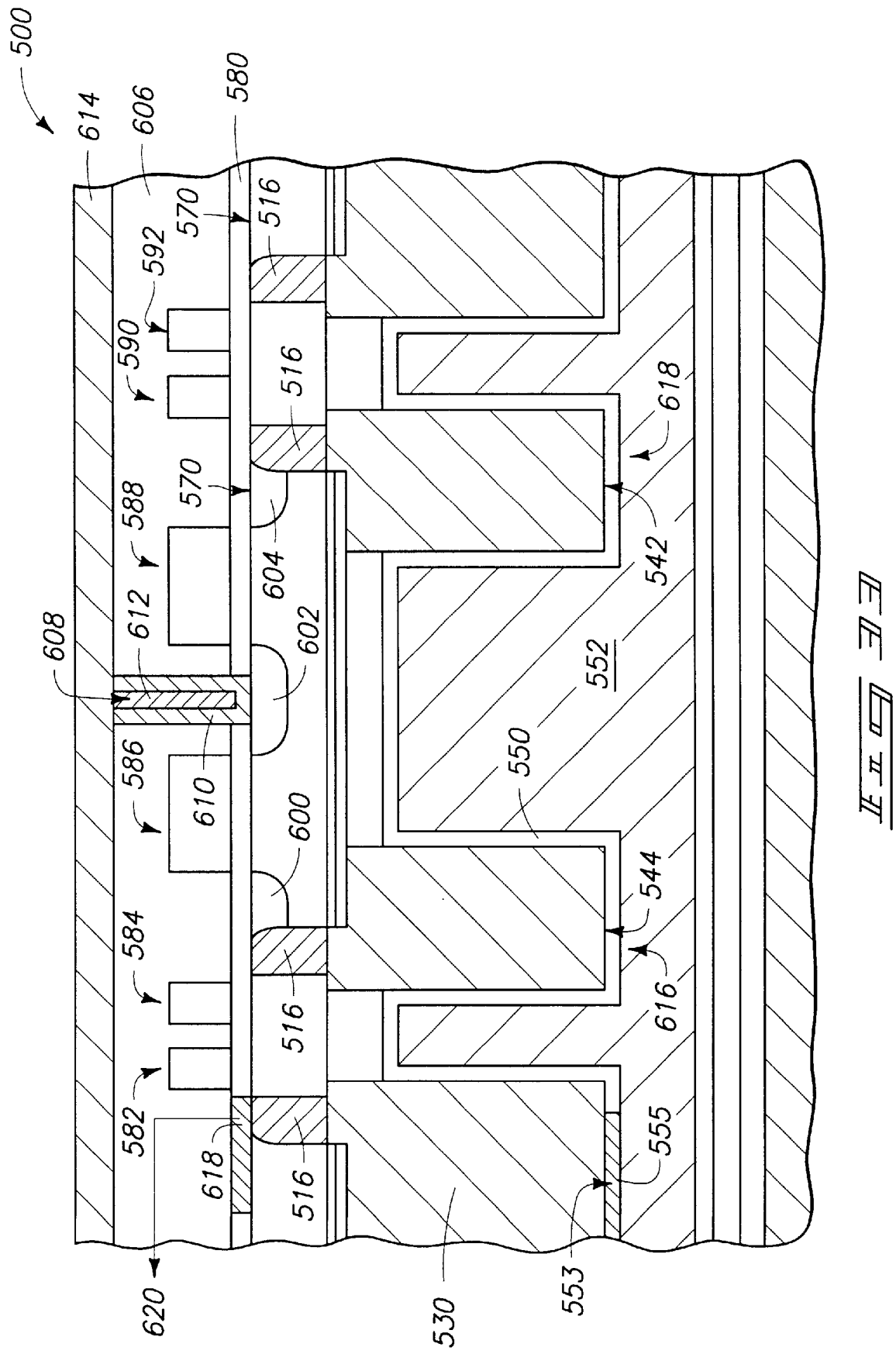

DRAM CELL CONSTRUCTIONS

RELATED PATENT DATA

This patent resulted from a divisional application of U.S. patent application Ser. No. 09/651,484, which was filed Aug. 30, 2000.

TECHNICAL FIELD

The invention pertains to DRAM cell constructions and methods of forming DRAM cells.

BACKGROUND OF THE INVENTION

Technologies referred to as "smart cut" and "wafer-bonding" have been utilized to bond monocrystalline silicon materials onto semiconductor substrates. Smart cut technology generally refers to a process in which a material is implanted into a silicon substrate to a particular depth and ultimately utilized to crack the substrate, and wafer bonding technology generally refers to a process in which a first semiconductive substrate is bonded to a second semiconductor substrate.

In particular applications of smart cut and wafer-bonding technology, hydrogen ions (which can be, for example, $H^+$, $H_2^+$, $D^+$, $D_2^+$) are implanted into a first monocrystalline silicon substrate to a desired depth. The first monocrystalline silicon substrate comprises a silicon dioxide surface, and is bonded to a second monocrystalline substrate through the silicon dioxide surface. Subsequently, the bonded first substrate is subjected to a thermal treatment which causes cleavage along the hydrogen ion implant region to split the first substrate at a pre-defined location. The portion of the first substrate remaining bonded to the second substrate can then be utilized as a silicon-on-insulator (SOI) substrate. An exemplary process is described in U.S. Pat. No. 5,953,622. The SOI substrate is subsequently annealed at a temperature of greater than or equal to 900° C. to strengthen chemical coupling within the second substrate.

The present invention encompasses new applications for smart cut and wafer-bonding technology, and new semiconductor structures which can be created utilizing such applications.

SUMMARY OF THE INVENTION

In one aspect, the invention encompasses a method of forming a DRAM cell. A first substrate is formed to comprise first DRAM sub-structures separated from one another by an insulative material. A second semiconductor substrate provided which comprises a monocrystalline material. The second semiconductor substrate is bonded to the first substrate after forming the first DRAM sub-structures. Second DRAM sub-structures are formed on either the first substrate or the second substrate and in electrical connection with the first DRAM sub-structures. Either the first DRAM sub-structures or the second DRAM sub-structures are transistor gate structures, and the other of the first and second DRAM sub-structures are capacitor structures.

In another aspect, the invention encompasses another method of forming a DRAM cell. A first substrate is formed to comprise first DRAM sub-structures separated from one another by an insulative material. The first DRAM sub-structures define an upper surface. A second semiconductor substrate is provided which comprises a monocrystalline material. The second semiconductor substrate is bonded to the first substrate above the first DRAM sub-structures. Second DRAM sub-structures are formed on the second substrate and in electrical connection with the first DRAM sub-structures. Either the first DRAM sub-structures or the second DRAM sub-structures are transistor gate structures, and the other of the first and second DRAM sub-structures are capacitor structures.

In yet another aspect, the invention encompasses a semiconductor structure which comprises a cell plate layer, a dielectric material over the cell plate layer, and a conductive storage node mass over the dielectric material. The conductive storage node mass, dielectric material and cell plate layer together define a capacitor structure, and a first substrate is defined to encompass the capacitor structure. The semiconductor structure further comprises a monocrystalline silicon substrate bonded to the first substrate and over the storage node mass. Additionally, the semiconductor structure comprises a transistor gate on the monocrystalline silicon substrate and operatively connected with the capacitor structure to define a DRAM cell.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing step of a first embodiment method of the present invention.

FIG. 2 is a view of the FIG. 1 wafer fragment shown at a processing step subsequent to that of FIG. 1.

FIG. 4 is a view of the FIG. 1 wafer fragment shown at a processing step subsequent to that of FIG. 3.

FIG. 12 is a view of the FIG. 1 wafer fragment shown at a processing step subsequent to that of FIG. 11.

FIG. 13 is a view of a wafer fragment at a preliminary processing step of a second method of the present invention.

FIG. 14 is a view of the FIG. 13 wafer fragment shown at a processing step subsequent to that of FIG. 13.

FIG. 25 is a diagrammatic, cross-sectional view of a semiconductor wafer fragment at a preliminary step of a fourth embodiment method of the present invention.

FIG. 26 is a view of the FIG. 25 wafer fragment shown at a processing step subsequent to that of FIG. 25.

FIG. 30 is a view of the FIG. 25 wafer fragment shown at a processing step subsequent to that of FIG. 29.

FIG. 31 is a view of the FIG. 25 wafer fragment shown at a processing step subsequent to that of FIG. 30.

FIG. 32 is a view of the FIG. 25 wafer fragment shown inverted relative to FIG. 25, and at a processing step subsequent to that of FIG. 31.

FIG. 33 is a view of the FIG. 25 wafer fragment shown in the same orientation as FIG. 32, and at a processing step subsequent to that of FIG. 32.

DETAILED DESCRIPTION OF THE PREFERRED EMBODIMENTS

Figure 5:
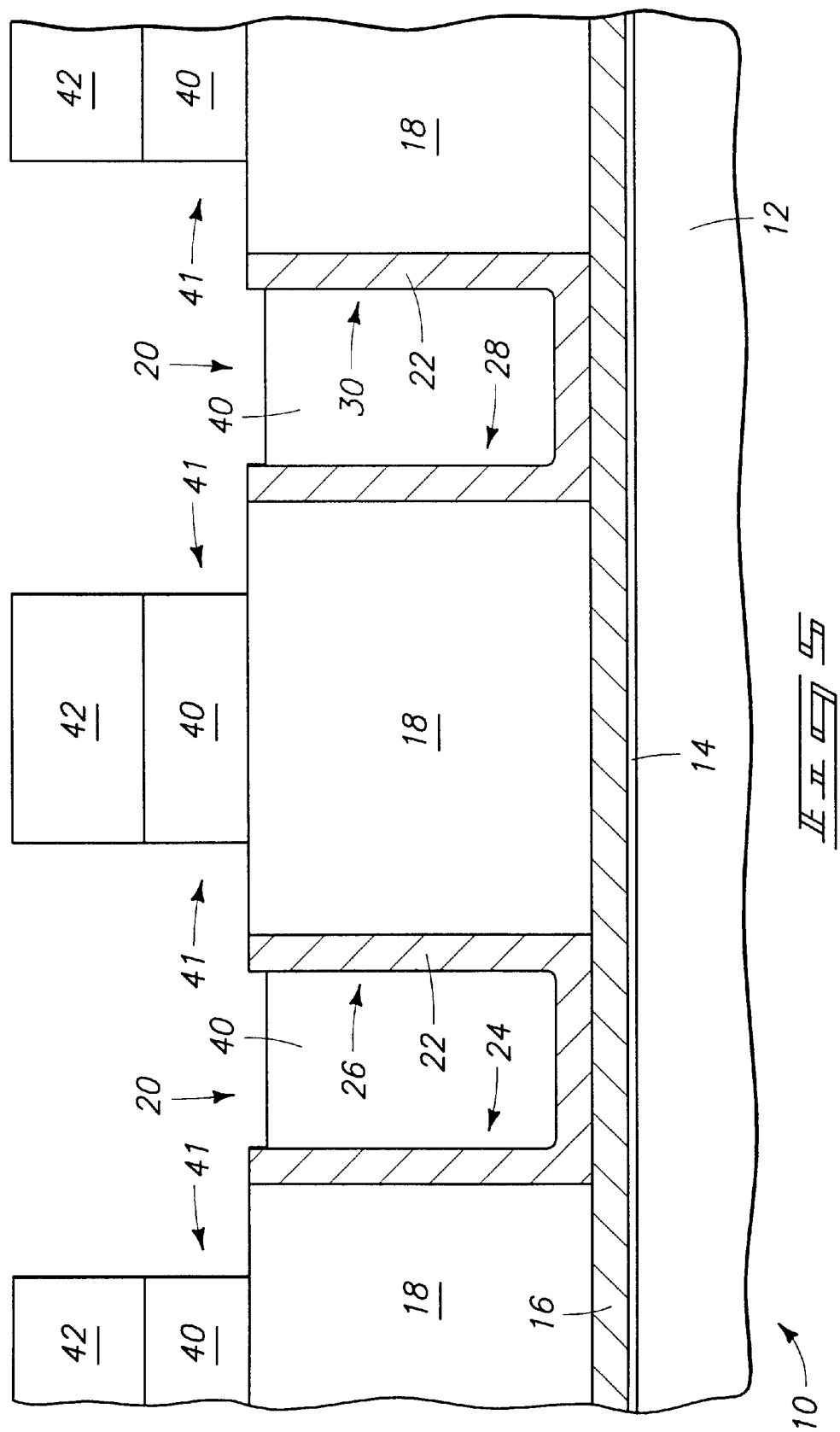
FIG. 5 is a view of the FIG. 1 wafer fragment shown at a processing step subsequent to that of FIG. 4.

This disclosure of the invention is submitted in furtherance of the constitutional purposes of the U.S. Patent Laws "to promote the progress of science and useful arts" (Article 1, Section 8).

A first embodiment method of the present invention is described with reference to FIGS. 1–12. Referring first to FIG. 1, a first semiconductor structure 10 is illustrated. Structure 10 comprises a semiconductive material wafer 12. Wafer 12 can comprise, for example, monocrystalline silicon lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is formed over wafer 12. It is noted that for purposes of interpreting this disclosure and the claims that follow, the spacial reference terms "over", "above", "beneath" and the like are utilized to describe relative orientations of various components to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

Insulative material 14 can be referred to as an insulative material base, and can comprise, for example, a layer of silicon dioxide.

A conductive material 16 is formed over layer 14. Material 16 can comprise, for example, metal, silicide, and/or conductively-doped silicon (such as, for example, conductively doped polysilicon).

Referring next to FIG. 2, an insulative material 18 is formed over conductive material 16. Insulative material 18 can comprise, for example, borophosphosilicate glass (BPSG), and can be formed to a thickness of, for example, from about 2 microns to about 4 microns. Openings 20 are formed within insulative material 18 to extend through insulative material 18 and to conductive material 16.

A conductive material 22 is formed over an upper surface of material 18 and within openings 20. Conductive material 22 can comprise, for example, metal, silicide, and/or conductively-doped silicon, and can have the same chemical composition as conductive material 16, or be different in chemical composition from conductive material 16.

In the shown embodiment, conductive material 22 is provided to only partially fill openings 20. Accordingly, conductive material 22 defines two conductive projections 24 and 26 within one of the openings 20, and defines another two conductive projections 28 and 30 within another of the openings 20. The conductive projections 24, 26, 28 and 30 extend substantially vertically from an upper surface of conductive material 16. Conductive projections 24, 26, 28 and 30 are in electrical contact with conductive material 16, and in the shown embodiment are formed on conductive material 16.

Conductive material 22 narrows the openings 20. A protective material 32 is formed within the narrowed openings and to a level approximately equal with an elevational level of an upper surface of insulative material 18. Protective material 32 can comprise, for example, photoresist, and is shown formed to elevational level that is above that of the upper surface of insulative material 18.

Figure 3I:
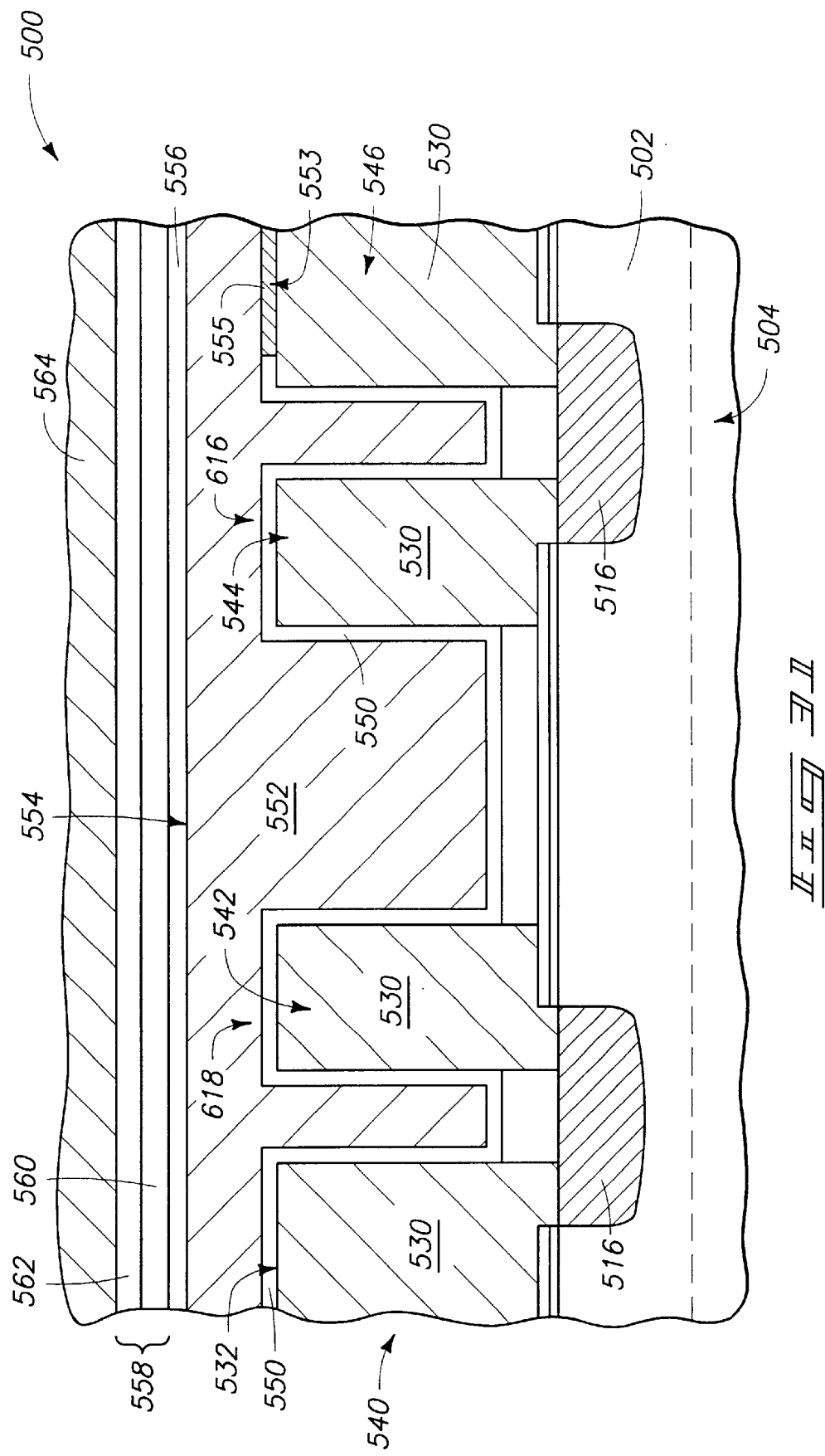
FIG. 3 is a view of the FIG. 1 wafer fragment shown at a processing step subsequent to that of FIG. 2.

Referring to FIG. 3, fragment 10 is subjected to planarization which removes material 22 from over an upper surface of insulative material 18, while leaving the conductive material 22 within openings 20. The protective material 20 (FIG. 2) prevents conductive particles of material 22 from falling within openings 20 during the planarization. An exemplary planarization process is chemical-mechanical planarization. After the planarization, protective material 32 is removed from within the openings. If material 32 comprises photoresist, such removal could comprise, for example, ashing of the photoresist. The portions of conductive material 22 within openings 20 define conductive container structures 23 and 25.

Referring to FIG. 4, an insulative material 40 is formed over insulative material 18 and within openings 20. Insulative material 40 can comprise, for example, silicon dioxide.

A patterned masking layer 42 is provided over insulative material 40. Patterned masking layer 42 can comprise, for example, photoresist which has been patterned by photolithographic processing.

Referring to FIG. 5, a pattern is transferred from patterned masking layer 42 to insulative material 40 to form patterned blocks 41 of insulative material 40 supported on insulative material 18, as well as to leave portions of insulative material 40 within openings 20.

Figure 6:
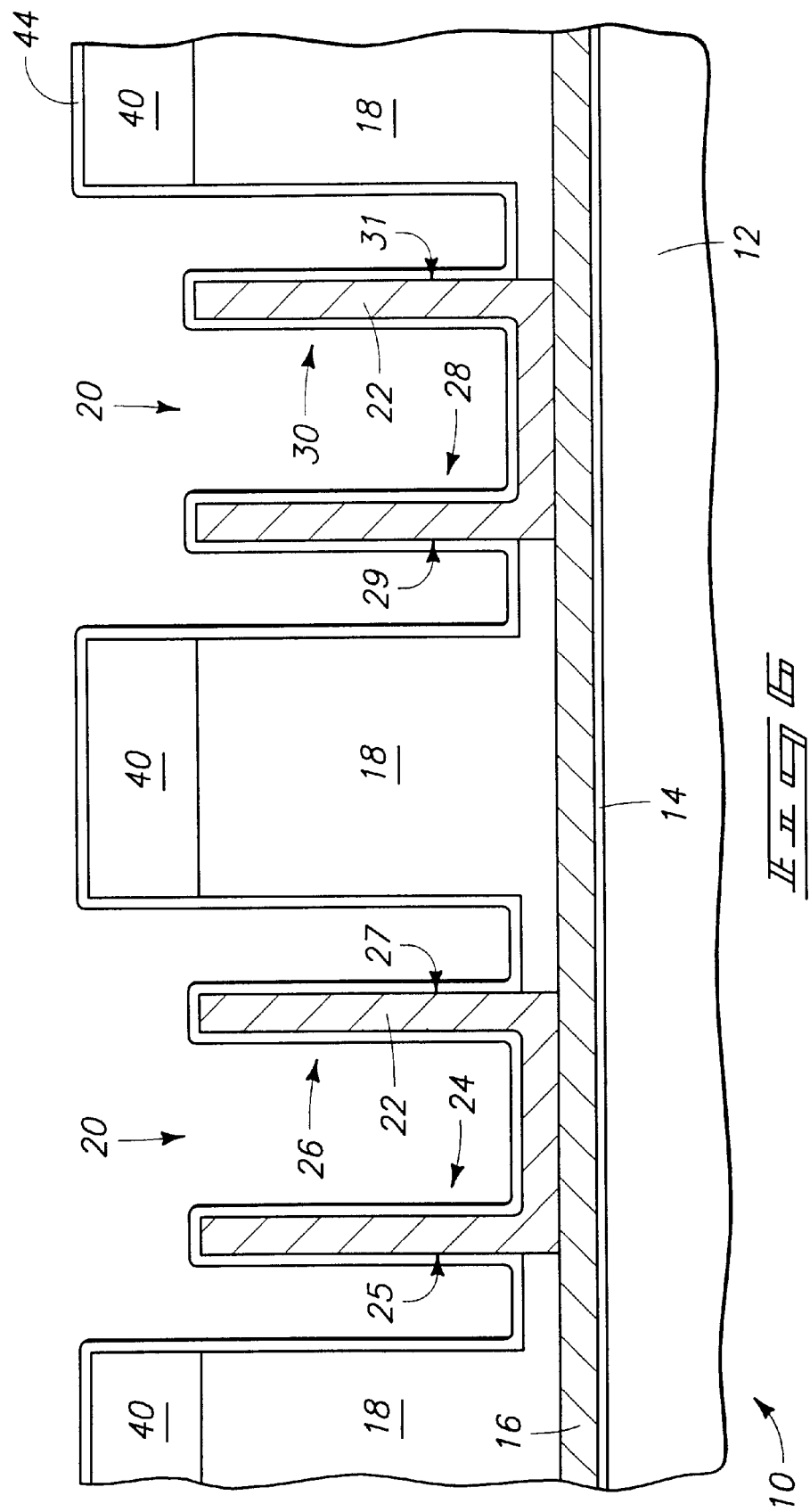
FIG. 6 is a view of the FIG. 1 wafer fragment shown at a processing step subsequent to that of FIG. 5.

The processing of FIG. 5 represents a partial etch into insulative materials 18 and 40. In particular embodiments, insulative materials 18 and 40 can comprise the same composition as one another, and can, for example, both comprise silicon dioxide. Accordingly, the etch of material 40 shown in FIG. 5 can be extended into material 18 as shown in FIG. 6 to remove material 18 from adjacent sidewalls of projections 24, 26, 28 and 30. Preferably, the etch utilized in FIGS. 5 and 6 is an etch selective for the insulative materials 18 and 40 relative to the conductive material 22. If conductive material 22 comprises conductively doped silicon and insulative materials 18 and 40 comprise silicon dioxide, a suitable etch can be, for example, fluorocarbon chemistry.

After the etch of material 18 from along sidewalls of projections 24, 26, 28 and 30, sidewall portions 25, 27, 29 and 31 are exposed. The projections thus comprise exposed top surfaces and sidewall surfaces. Photoresist 42 (FIG. 5) is subsequently removed, and a dielectric material 44 is deposited over insulative materials 40 and 18, as well as over the exposed top surfaces and sidewall surfaces of conductive projections 24, 26, 28 and 30. The dielectric material 44 extends along sidewall portions 25, 27, 29 and 31 of conductive projections 24, 26, 28 and 30, as well as within a narrowed openings 20 (i.e., between conductive projections 24 and 26, and between conductive projections 28 and 30). Dielectric material 44 can comprise, for example, one or more of silicon dioxide, silicon nitride, or other dielectric materials. In a particular embodiment, dielectric material 44 can comprise a layer of silicon nitride between two layers of silicon dioxide.

Figure 7:
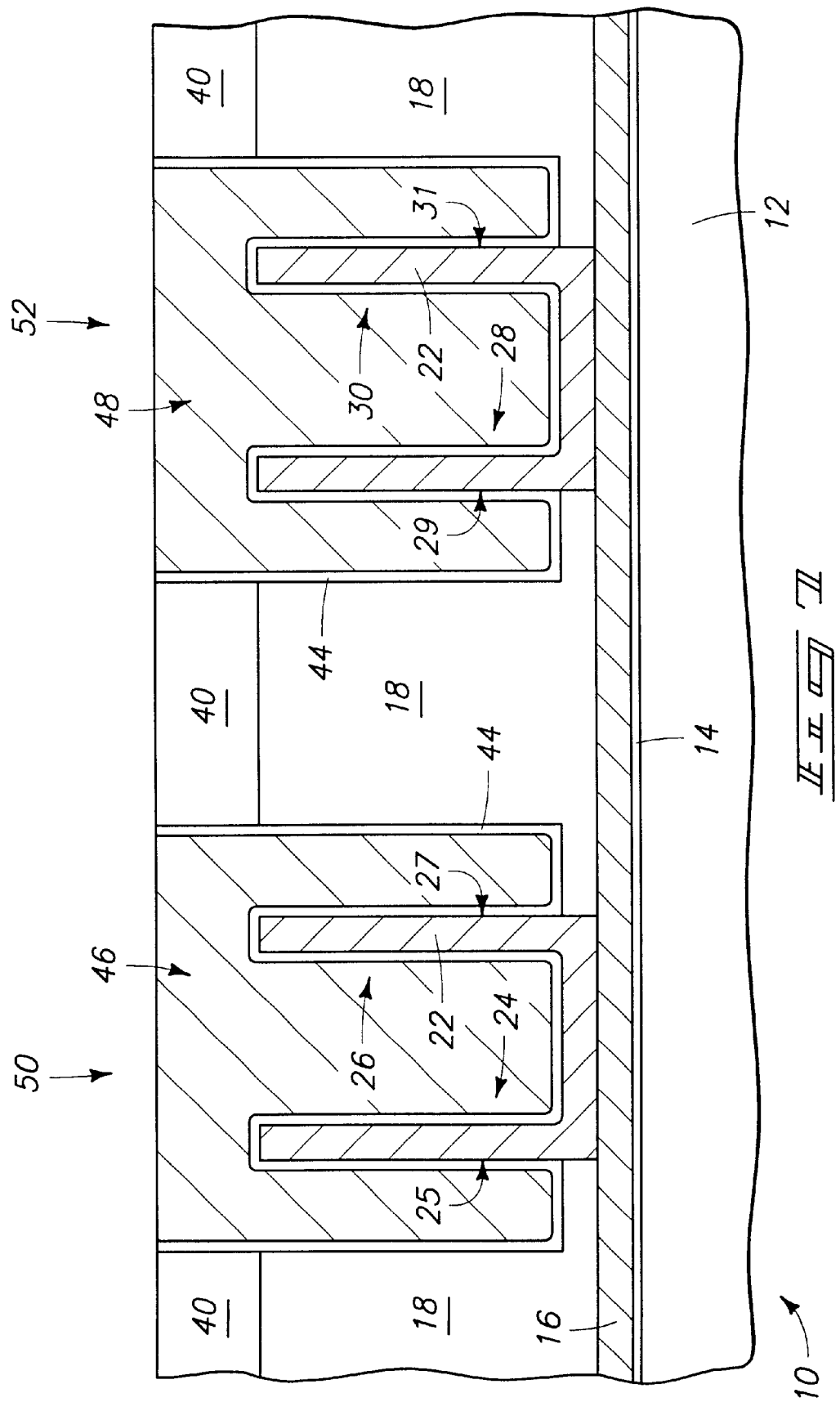
FIG. 7 is a view of the FIG. 1 wafer fragment shown at a processing step subsequent to that of FIG. 6.

Referring to FIG. 7, a first storage node mass 46 is formed over conductive projections 24 and 26, and a second storage node mass 48 is formed over conductive projections 28 and 30. Storage node masses 46 and 48 are spaced from the conductive material 22 of projections 24, 26, 28 and 30 by dielectric material 44. Storage node masses 46 and 48 can comprise, for example, conductive materials such as metal, silicide, and/or conductively-doped silicon (such as, for example, conductively-doped polysilicon). The shown storage mass structures 46 and 48 can be formed by, for example, forming a conductive material over insulative materials 40 and 18, as well as over the dielectric material 44 of the FIG. 6 construction, and subsequently subjecting structure 10 to planarization (such as, for example, chemical-mechanical polishing). The planarization removes the conductive material from over insulative mass 40, and thus forms electrically isolated storage node masses 46 and 48 from the conductive material.

Storage node mass 46, together with projections 26 and 28, and dielectric material 44, defines a first capacitor construction 50. Storage node mass 48 together with projections 28 and 30, and dielectric material 44, defines a second capacitor structure 52.

Figure 8:
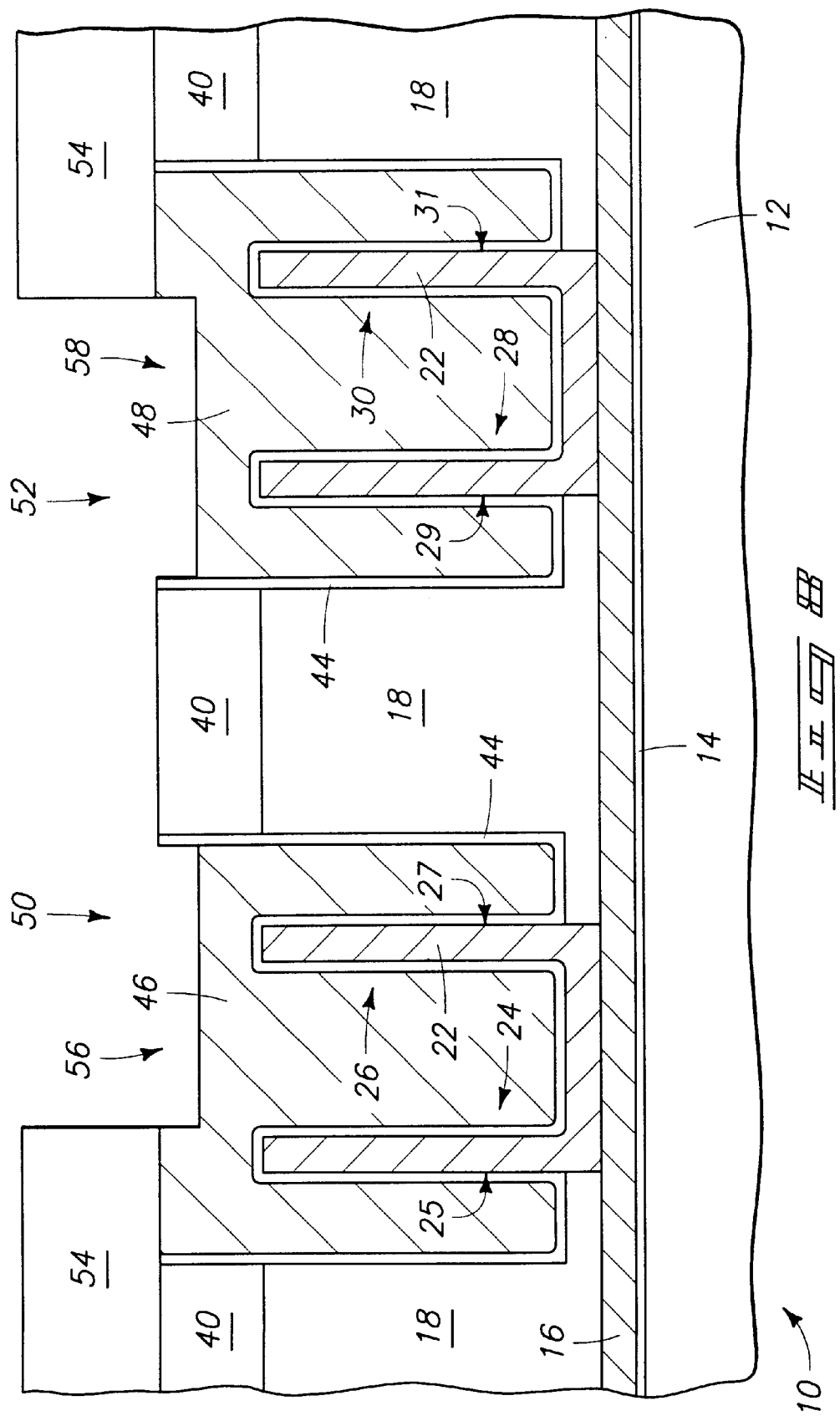
FIG. 8 is a view of the FIG. 1 wafer fragment shown at a processing step subsequent to that of FIG. 7.

Referring to FIG. 8, a patterned masking material 54 is provided over portions of storage node masses 46 and 48, while leaving other portions of the masses exposed. Masking layer 54 can comprise, for example, photoresist which is patterned by photolithographic processing. After formation of patterned masking layer 54, fragment 10 is subjected to an etch which etches conductive material 46 selectively relative to insulative materials 44 and 40. If conductive material 46 comprises conductively-doped silicon, and insulative materials 44 and 40 comprise silicon dioxide and/or silicon nitride, a suitable etch can comprise, for example, fluorocarbon chemistry. The etching forms trenches 56 and 58 extending into upper surfaces of storage node masses 46 and 48, respectively.

Figure 9:
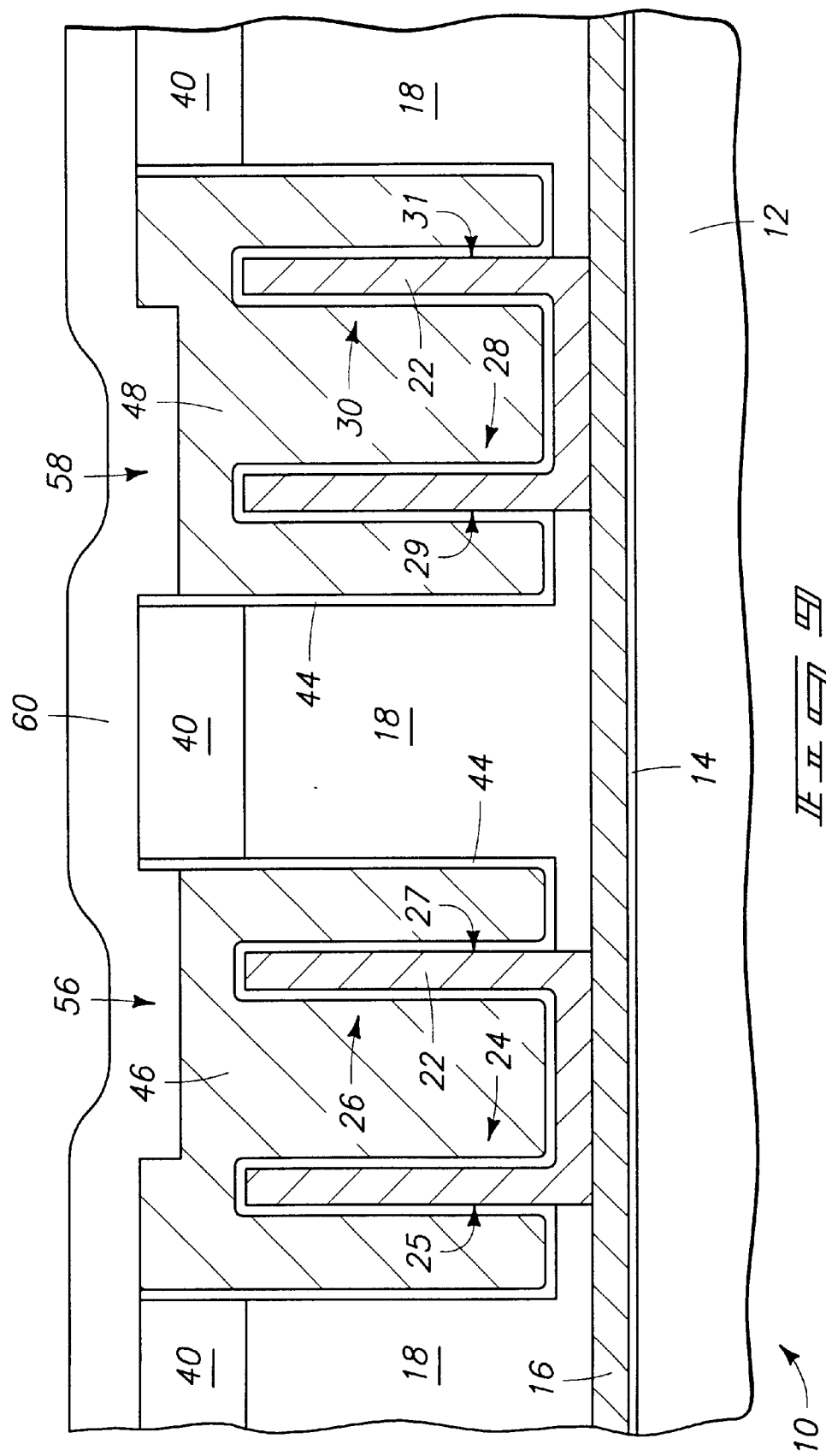
FIG. 9 is a view of the FIG. 1 wafer fragment shown at a processing step subsequent to that of FIG. 8.

Referring to FIG. 9, patterned masking layer 54 (FIG. 8) is removed. Subsequently, an insulative material 60 is formed over storage node masses 46 and 48 and within trenches 56 and 58. Insulative material 60 can comprise, for example, silicon dioxide, or alternatively can consist of, or consist essentially of, silicon dioxide.

Figure 10:
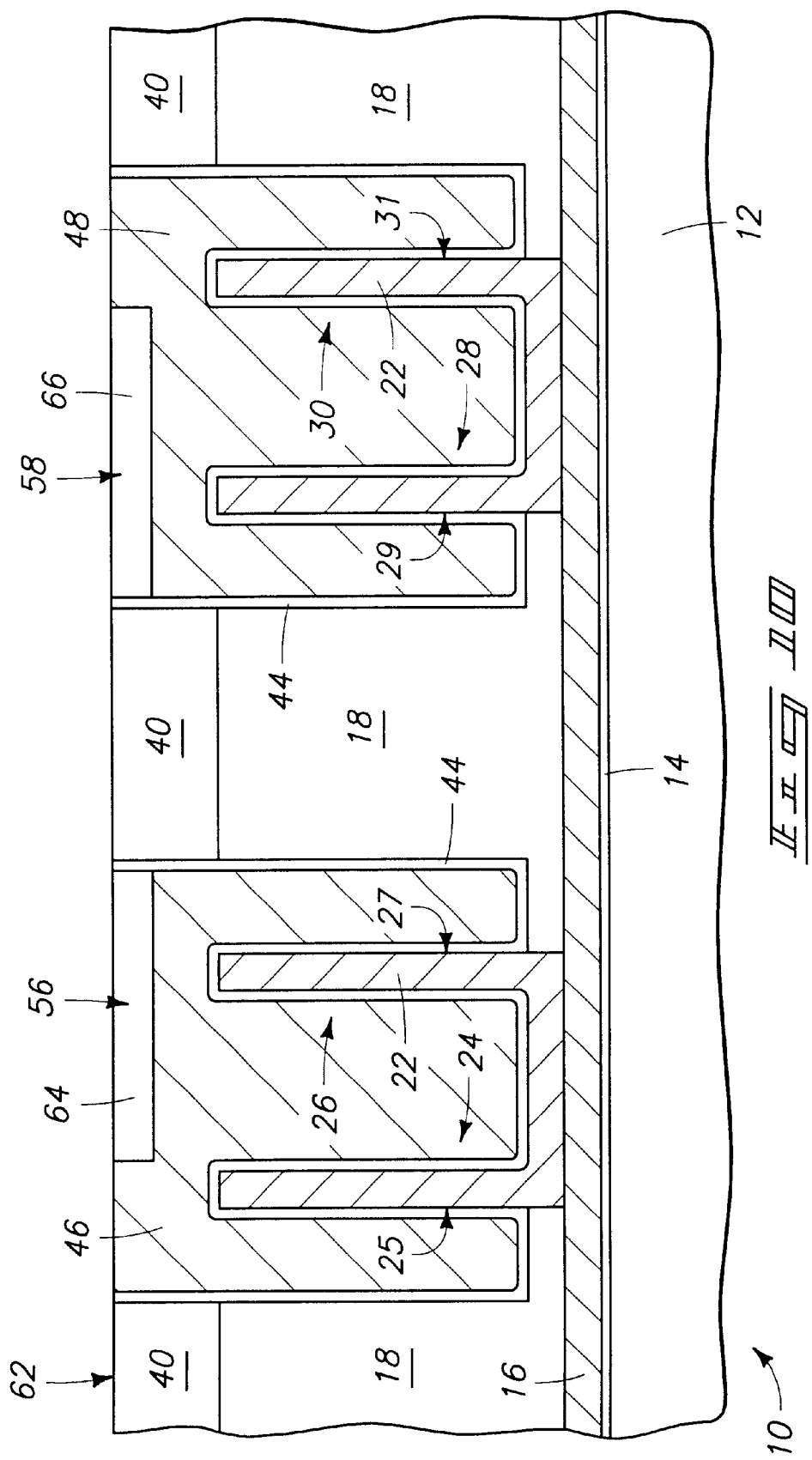
FIG. 10 is a view of the FIG. 1 wafer fragment shown at a processing step subsequent to that of FIG. 9.

Referring to FIG. 10, fragment 10 is subjected to fine control planarization to form a planarized upper surface 62, and to remove insulative material 60 from over upper surfaces of storage node masses 46 and 48 while leaving insulative material 60 within trenches 56 and 58. The insulative material within trenches 56 and 58 defines dopant barrier regions 64 and 66, respectively. Dopant barrier regions 64 and 66 can inhibit out-diffusion of dopant upwardly from storage node masses 46 and 48. The insulative material within regions 64 and 66 can be referred to as an ultra-thin dopant barrier material. It is noted that although the dopant barrier material is referred to above as an insulative material, the invention also encompasses embodiments in which the dopant barrier material is a conductive material.

Figure 11:
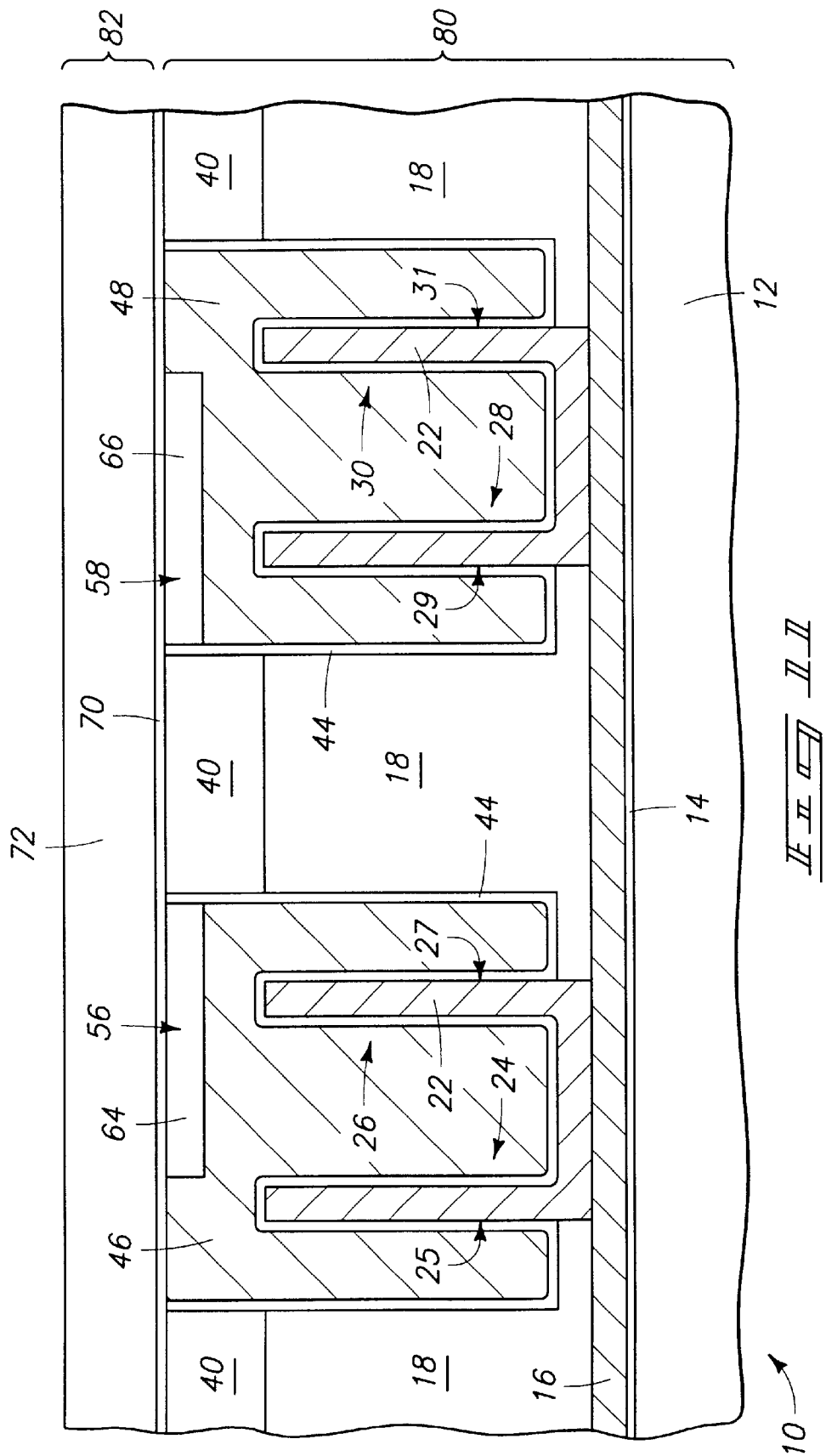
FIG. 11 is a view of the FIG. 1 wafer fragment shown at a processing step subsequent to that of FIG. 10.
Figure 11:
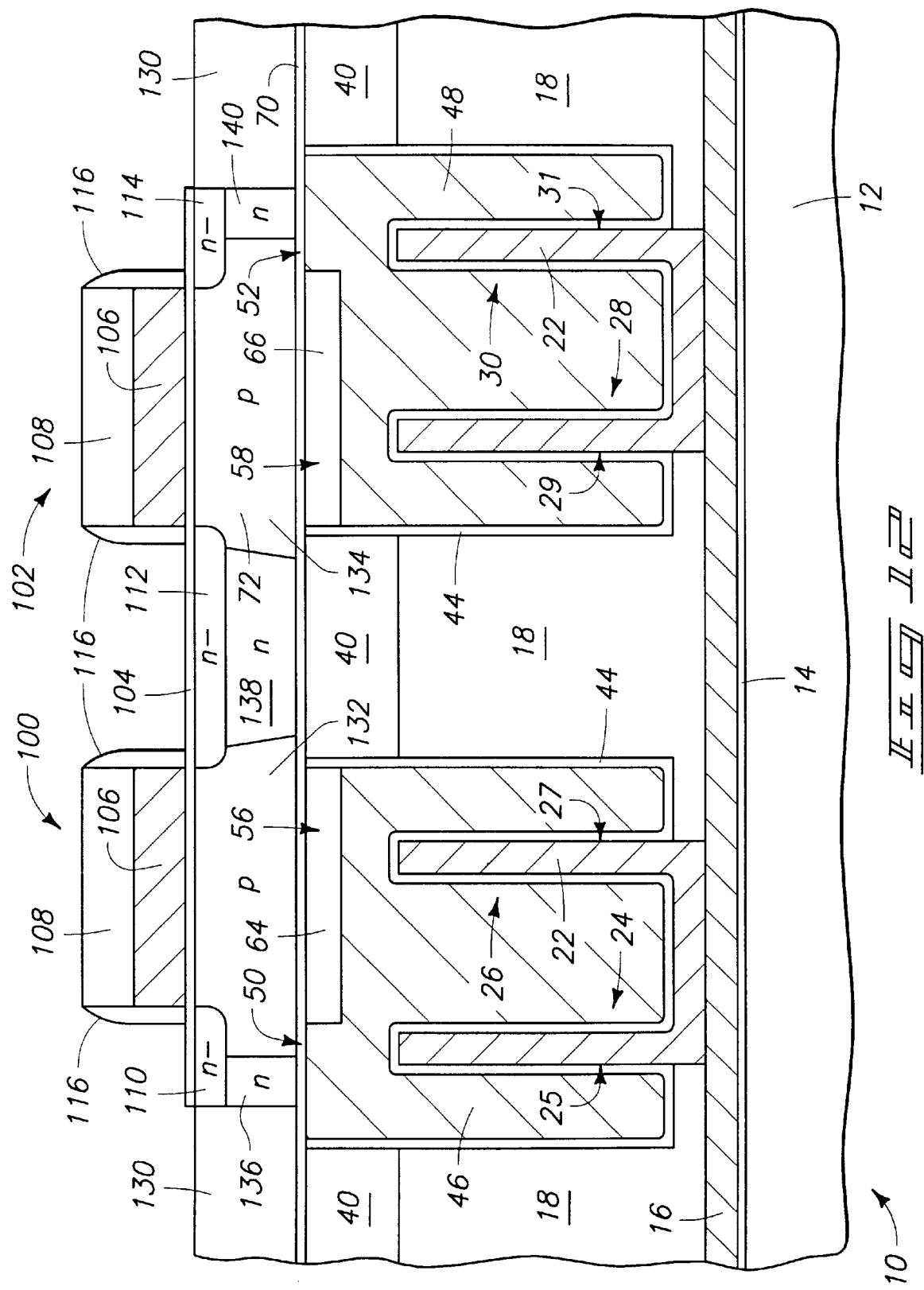
Figure 11:
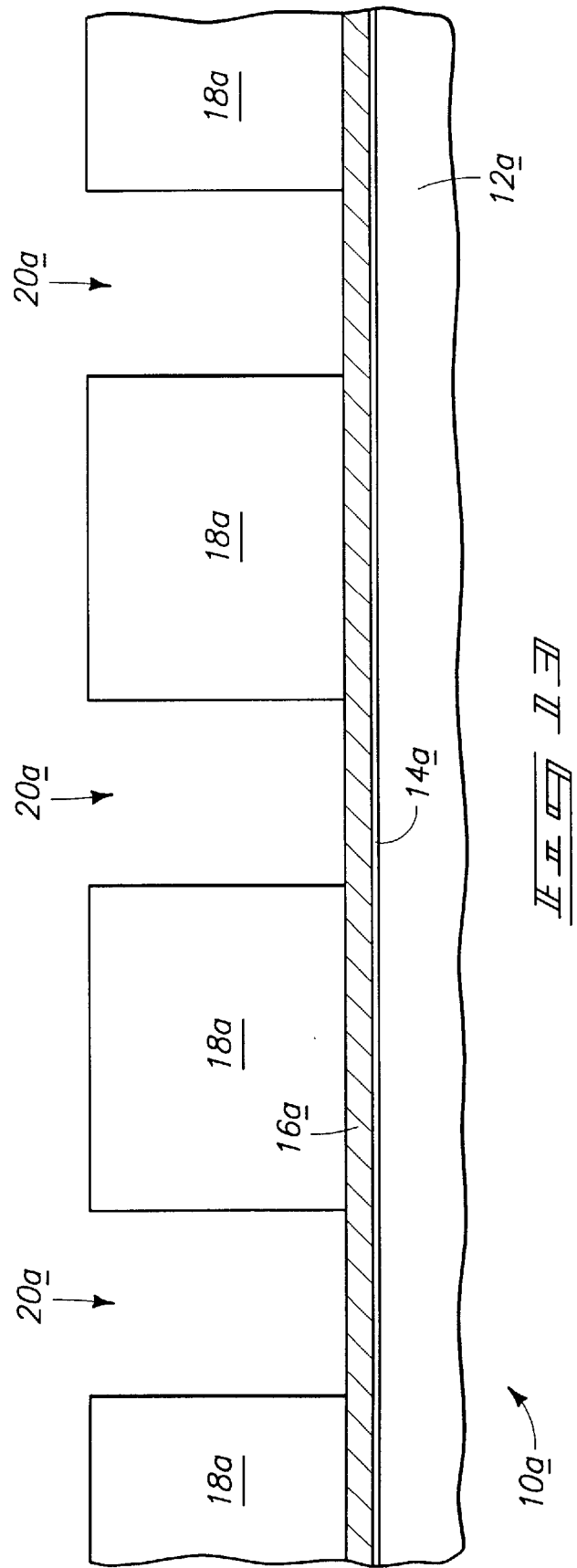

Referring to FIG. 11, a silicon-containing layer 70 is formed over storage node masses 46 and 48, as well as over dopant barrier regions 64 and 66. Silicon-containing layer 70 can comprise, for example, undoped amorphous silicon, and is preferably provided to be from about 50 Å thick to about 100 521 thick. Silicon-containing layer 70 can also consist essentially of amorphous silicon or consist of amorphous silicon. The undoped amorphous silicon can ultimately function as a bonding surface in the methodology described herein. Amorphous silicon typically deposits in a relatively planar form, and accordingly the thin amorphous silicon layer 70 can be deposited directly over planarized surface 62 to form a thin layer of amorphous silicon having a substantially planar top surface. Alternatively, layer 70 can be provided to be thicker than 100 Å, and subsequently reduced to about 100 Å thick or less by chemical-mechanical polishing to form a planarized top surface of the amorphous silicon.

Layer 70 is preferably provided to be undoped (in other words resistive). If layer 70 were not resistive, it would form a short between adjacent storage nodes 46 and 48. Dopant diffusion regions 64 and 66 prevent out-diffusion of dopant from storage node masses 46 and 48 into the region of amorphous silicon layer 70 extending between conductive masses 46 and 48.

A second monocrystalline silicon base 72 is bonded to silicon-containing layer 70. Such bonding can be accomplished by, for example, annealing at a temperature of from about 500° C. to about 750° C. for a time of from about 1 minute to about 3 hours. It is noted that although base 72 is referred to as a monocrystalline silicon base, the invention encompasses embodiments wherein base 72 comprises other semiconductive materials either alternatively or in addition to monocrystalline silicon, such as, for example, monocrystalline germanium. Base 72 can have a damage region therein (not shown) and be cleaved by smart cut technology subsequent to bonding base 72 to layer 70. If base 72 is cleaved by smart cut technology, it is preferably subsequently planarized after such cleavage. If base 72 comprises a damage region which is subsequent cleaved, the cleavage can occur either above or below sub-assemblies formed on base 72. Base 72 can also comprise a monocrystalline material that does not have a damage region therein, and which is accordingly not cleaved by smart cut technology.

It is noted that storage node masses 46 and 48 together with the materials therebeneath and oxide layers 40 and 18 can be considered to define a first semiconductor substrate 80, and base 72 can be considered to define a second semiconductor substrate 82 bonded atop the first semiconductor substrate. Alternatively, the first semiconductor substrate can be considered to comprise amorphous silicon layer 70, in combination with the materials thereunder.

Referring to FIG. 12, transistor devices 100 and 102 are formed over and within semiconductive material base 72. Transistor devices 100 and 102 comprise a gate oxide layer 104, a conductive material layer 106 and an insulative material layer 108. Conductive material layer 106 can comprise one or more conductive materials, such as, for example, a stack of metal and/or silicide over conductively-doped polysilicon. Insulative material 108 can comprise, for example, silicon nitride or silicon dioxide. Gate oxide layer 104 can comprise silicon dioxide. Lightly doped source/drain regions 110, 112 and 114 are implanted proximate gates 100 and 102. Source/drain regions 110, 112 and 114 can be implanted utilizing gates 100 and 102 as masks, and are doped to a concentration of from about $10^{17}$ atoms/cm$^3$ to about $10^{21}$ atoms/cm$^3$. The source/drain regions can comprise n-type or p-type dopant. In the shown embodiment, they comprise n-type dopant.

After forming source/drain regions 110, 112 and 114; insulative sidewall spacers 116 are formed along sidewalls of the gates of transistor devices 100 and 102. Sidewall spacers 116 can be formed by, for example, depositing an insulative material and subsequently anisotropically etching the material. Suitable insulative materials are, for example, silicon dioxide and silicon nitride.

Base 72 is preferably processed prior to formation of transistor devices 100 and 102 to form insulative oxide regions 130, channel implant regions 132 and 134, and heavily doped source/drain regions 136, 138 and 140.

The formation of oxide regions 130 can be accomplished by, for example, forming trenches within base 72 at locations wherein oxide regions 130 are ultimately to be formed, and subsequently filling the trenches with silicon dioxide. The trenches can be formed by providing a patterned mask to protect regions of base 72 while etching other regions of base 72 to remove such other regions and form the trenches therein.

Doped regions 132, 136, 138, 134 and 140 can be formed by implanting dopants into base 72 and/or by removing portions of base 72 and subsequently refilling the portions with conductively-doped semiconductive material. For instance, doped regions 136, 138 and 140 can be formed by implanting n-type dopant throughout base 72. Alternatively, regions 136, 138 and 140 can be formed by removing portions of base 72 to form trenches at locations wherein regions 136, 138 and 140 are ultimately to be formed, and subsequently filling the trenches with heavily-doped semiconductive material, (such as, for example, heavily doped polysilicon, with "heavily doped" referring to a dopant concentration of at least about $10^{18}$ atoms/cm$^3$). In the shown embodiment, regions 136, 138 and 140 are doped with n-type dopant. It is to be understood, however, that source/drain regions 136, 138 and 140 could alternatively comprise p-type doped regions. Also, although regions 132 and 134 are shown doped with p-type dopant, it is to be understood that the invention encompasses other embodiments wherein one or both of regions 132 and 134 is doped with n-type dopant.

Transistor structures 100 and 102, together with capacitor constructions 50 and 52 comprise a pair of DRAM cells. Specifically, one of the cells comprises transistor 100 in combination with capacitor 50, while another of the cells comprises transistor 102 in combination with capacitor 52. Source/drain regions 112 and 138 comprises a bit line contact for the DRAM cells.

Transistors 100 and 102 can be considered to be DRAM sub-assemblies formed over base 72, and capacitors 50 and 52 can be considered DRAM sub-assemblies formed between base 12 and base 72.

It is noted that in the shown construction the source/drain regions 136 and 140 are vertically extending through base 72 and over storage node masses 46 and 48. Particularly, it is noted that source/drain regions 136 and 140 are directly over storage node masses 46 and 48, respectively; with the term "directly over" indicating that the conductive regions extend vertically over portions of storage node masses 46 and 48. Source/drain regions 136 and 140 can be electrically connected with storage node masses 46 and 48 by out-diffusing dopant from regions 136 and 140 into silicon-containing layer 70 to form conductively doped regions within layer 70. Such conductively-doped regions can be conductive interconnects which extend from storage node masses 46 and 48 to source/drain regions 136 and 140, and which thus electrically connect the source/drain regions with the storage node masses. It is noted that although source/drain regions 136 and 140 are shown terminating above silicon-containing layer 70, the invention encompasses other embodiments (not shown) wherein the heavily doped source/drain regions extend through silicon-containing layer 70.

Another embodiment of the invention is described with reference to FIGS. 13–19. In describing the embodiment of FIGS. 13–19, similar numbering will be used as was used above in describing the embodiment of FIGS. 1–12, with the suffix "a" used to indicate structures in FIGS. 13–19.

Referring initially to FIG. 13, a fragment 10a comprises a base 12a, an insulative layer 14a, and a conductive layer 16a. Structures 12a, 14a and 16a can comprise the same materials as structures 12, 14 and 16 of FIG. 1.

A patterned insulative material 18a is formed over layer 16a. Patterned insulative material 18a can comprise the same material as insulative material 18 of FIG. 1, and can be formed to a thickness of, for example, from about 2 microns to about 4 microns. Openings 20a extend through patterned insulative material 18a to an upper surface of conductive material 16a. Three openings 20a are formed in structure 10a of FIG. 13, in contrast to the two openings 20 formed in structure 10 of FIG. 2.

Referring to FIG. 14, a conductive material 22a is formed within openings 20a to narrow the openings. Conductive material 22a can comprise the same material as conducive material 22 of FIGS. 2 and 3, and can be formed and patterned utilizing the methodology described above with reference to FIGS. 2 and 3.

A dielectric material 44a is formed within openings 20a. Dielectric material 44a can comprise the same materials as described above for dielectric material 44 of FIG. 6.

The structure of FIG. 14 comprises three isolated conductive container structures 200, 202, and 204. Structures 200 and 202 are analogous to the structures 23 and 25 of FIG. 3, and structure 204 is ultimately to comprise a conductive interconnect between conductive layer 16 and other circuitry (not shown).

Figure 15:
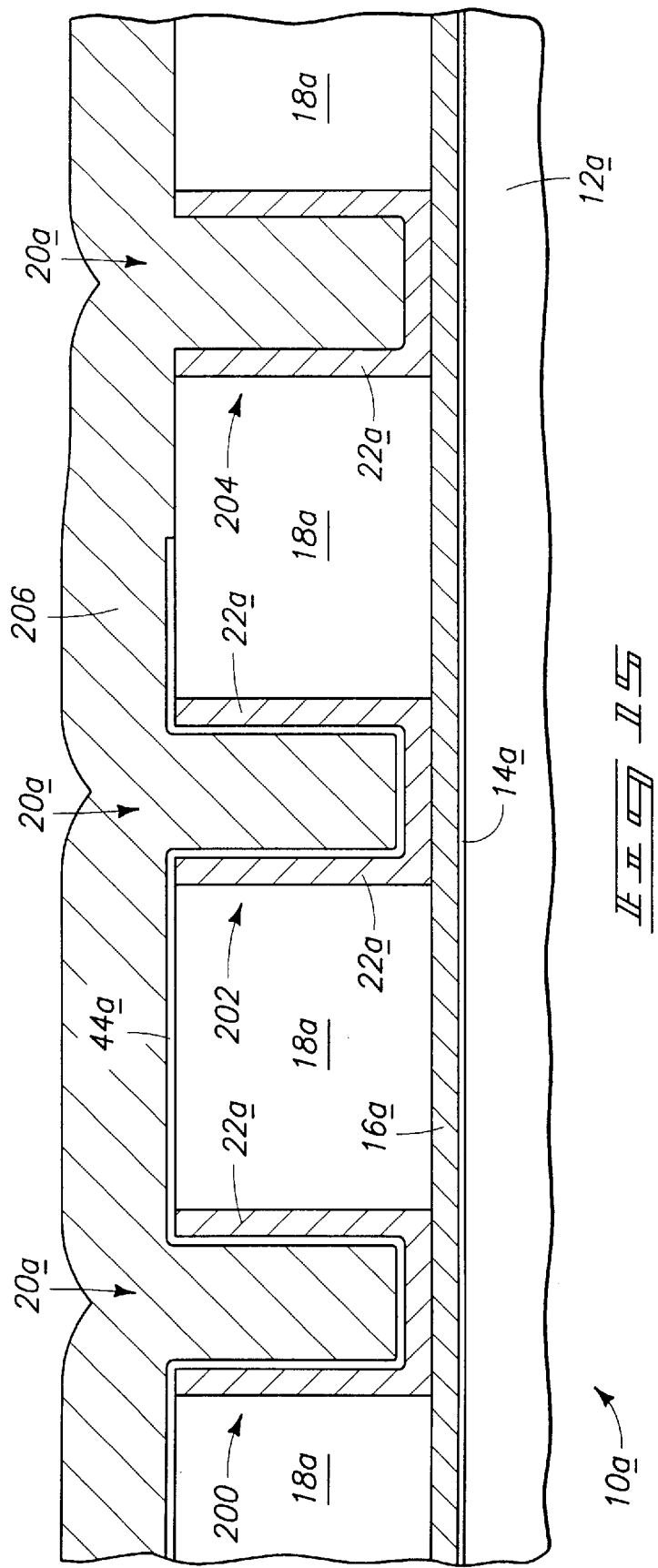
FIG. 15 is a view of the FIG. 13 wafer fragment shown at a processing step subsequent to that of FIG. 14.

Referring to FIG. 15, dielectric material 44a is patterned to remove the material from over conductive structure 204, while leaving the material over conductive structures 200 and 202. Such patterning can be accomplished by, for example, forming a patterned layer of photoresist over the dielectric material and subsequently transferring a pattern from the patterned photoresist to the dielectric material by etching the dielectric material. The photoresist can then be removed from over the patterned dielectric material.

A conductive material 206 is formed within narrowed openings 20a and over structures 200, 202 and 204. Conductive material 206 can comprise, for example, conductively doped polysilicon.

Figure 16:
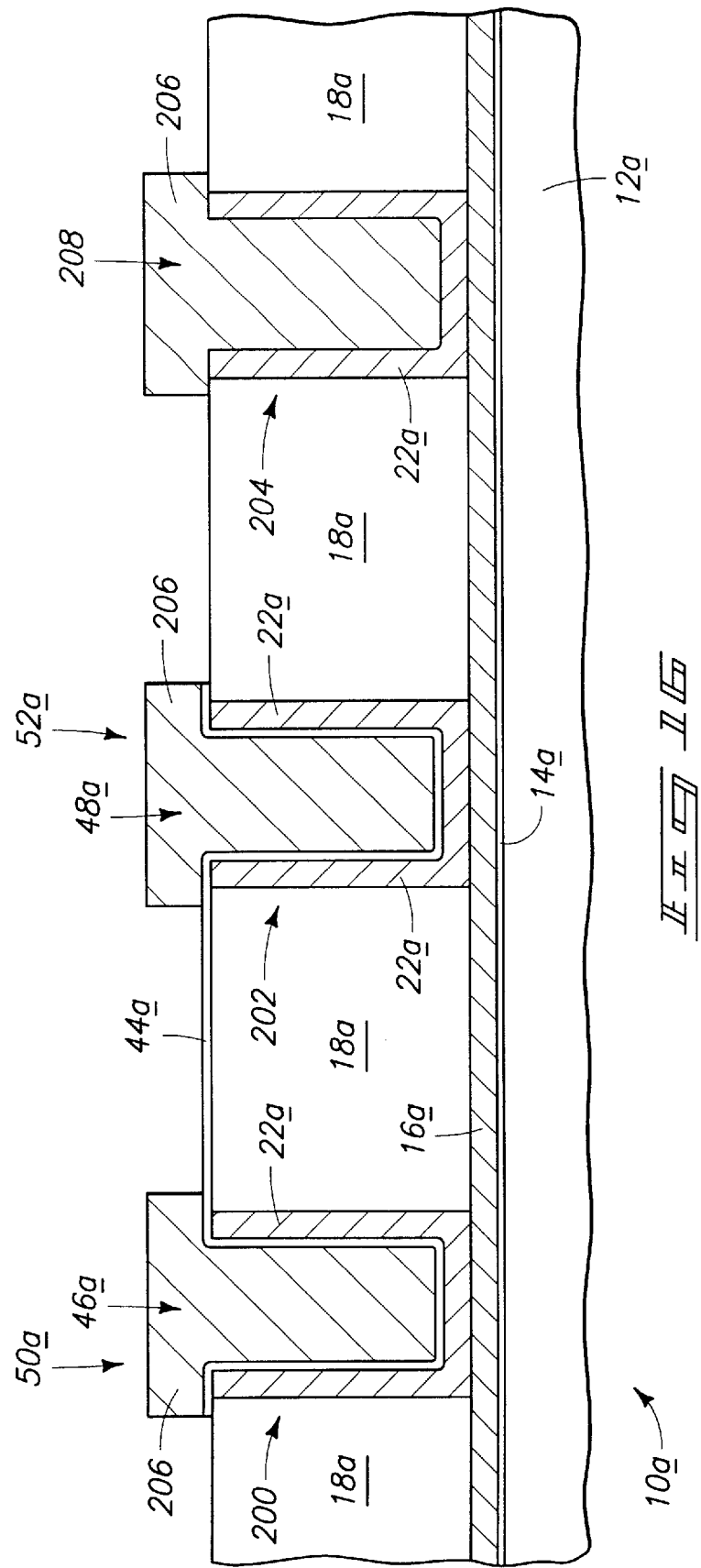
FIG. 16 is a view of the FIG. 13 wafer fragment shown at a processing step subsequent to that of FIG. 15.

Referring to FIG. 16, conductive material 206 is patterned to form storage node masses 46a and 48a, as well as to form a conductive mass 208 within and over conductive structure 204. The patterning of conductive material 206 can be accomplished by, for example, forming a patterned layer of photoresist over material 206 and subsequently transferring a pattern from the photoresist to material 206 with an etch of material 206. The photoresist can then be removed, to leave the structures shown in FIG. 16. Storage node masses 46a and 48a, together with dielectric material 44a and conductive containers 200 and 202, define capacitor structures 50a and 52a.

Figure 17:
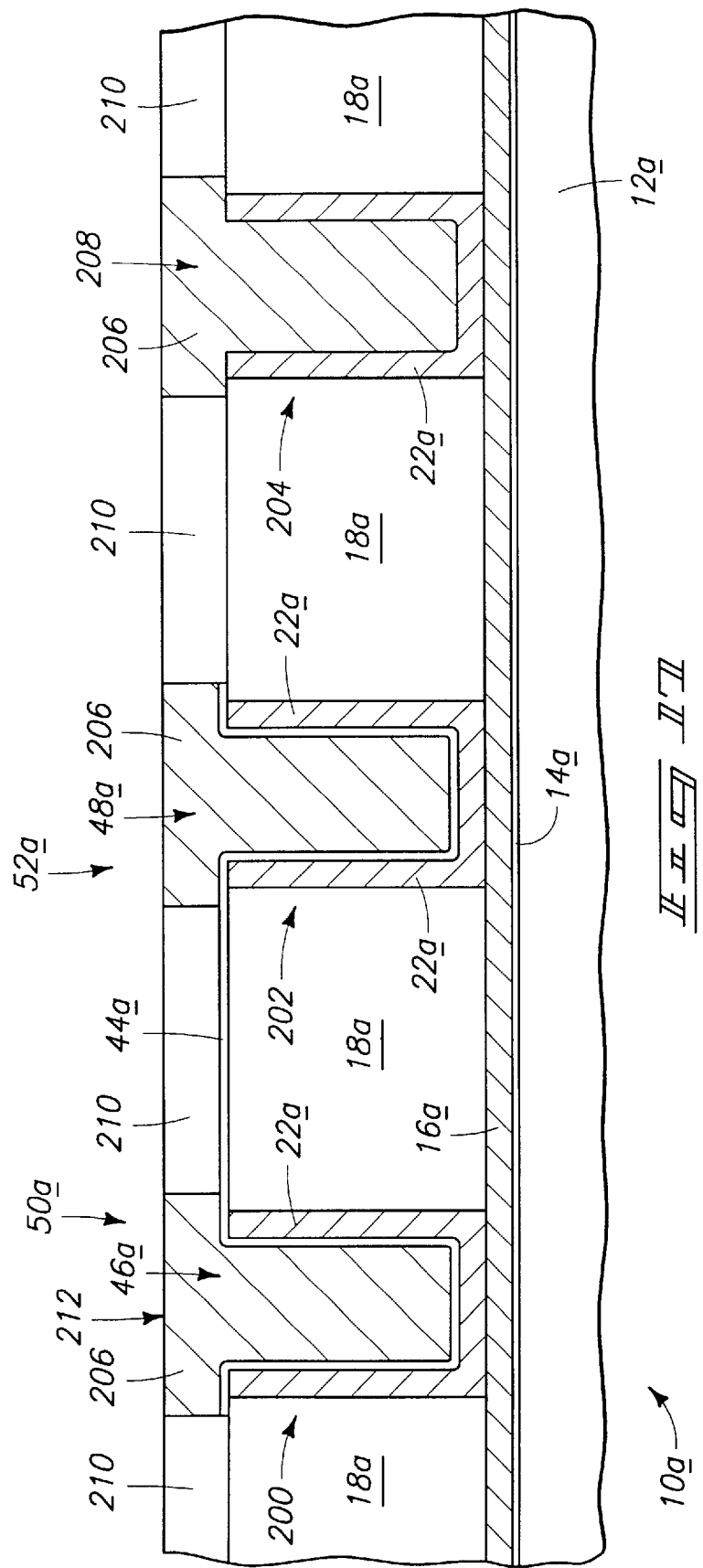
FIG. 17 is a view of the FIG. 13 wafer fragment shown at a processing step subsequent to that of FIG. 16.

Referring to FIG. 17, an insulative material 210 is formed between conductive structures 46a, 48a and 208; and over insulative material 18a. Insulative material 210 can comprise, for example, silicon dioxide. Insulative material 210 can be formed between structures 46a, 48a and 208 by forming the insulative material over and between structures 46a, 48a and 208, and subsequently planarizing the insulative material to remove the insulative material from over structures 46a, 48a and 208. A suitable planarization method is chemical-mechanical polishing. The planarization can also remove some of conductive material 206 to form a planarized upper surface 212 which extends across structures 46a, 48a and 208, as well as across insulative regions 210.

Figure 18:
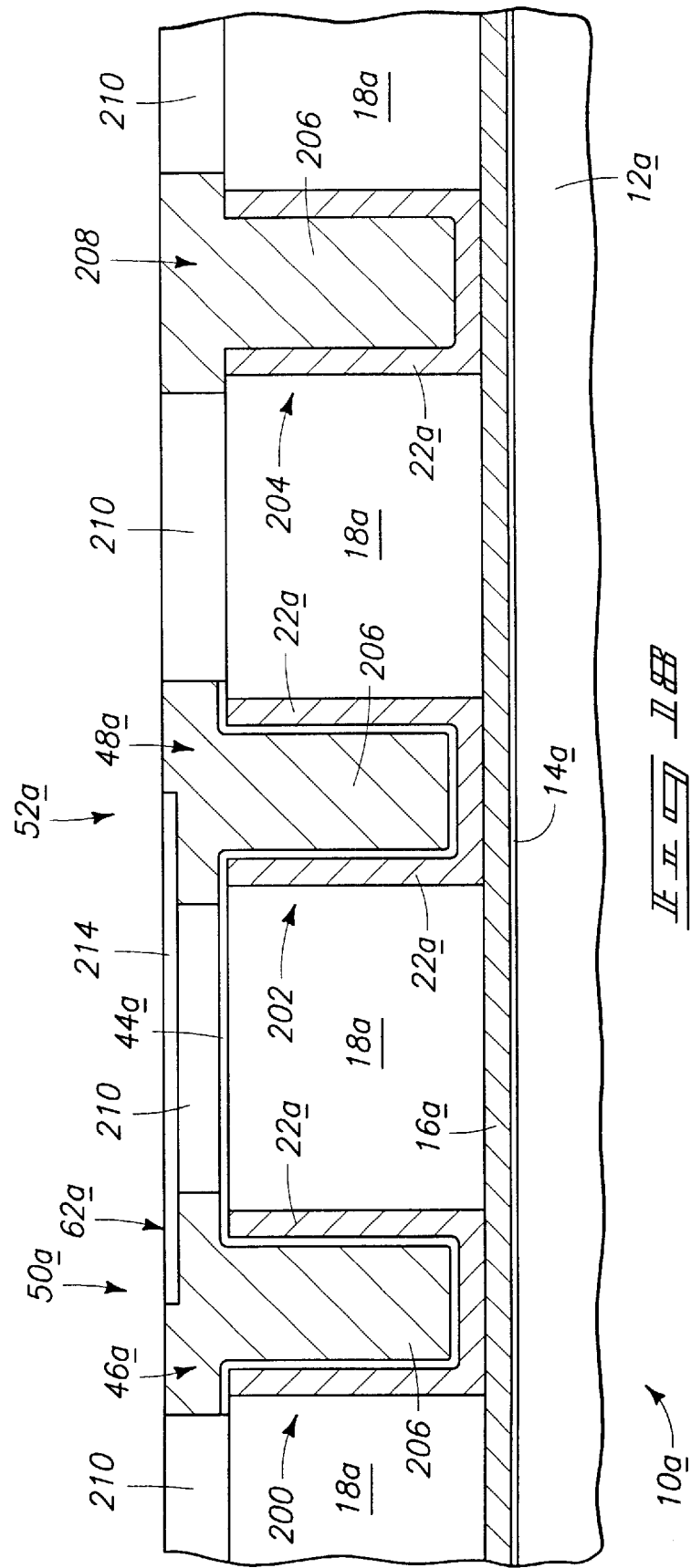
FIG. 18 is a view of the FIG. 13 wafer fragment shown at a processing step subsequent to that of FIG. 17.

Referring to FIG. 18, a dopant diffusion region 214 is formed between and within structures 46a and 48a. Diffusion region 214 can be formed by trenching into structures 46a, 48a and the intervening oxide region, and subsequently filling the trench with a suitable material, such as, for example, silicon dioxide. The trench and refill can be analogous to the trench and refill described with reference to FIGS. 8–11, with the exception that the trenching of FIG. 18 has extended into the insulative material 210, as well as into conductive structures 46a and 48a. The diffusion region 214, in contrast to the diffusion regions 64 and 66, preferably comprises an insulative dopant barrier material to avoid shorting between nodes 46a and 48a.

After dopant isolation region 214 is formed, an upper surface of fragment 10a is planarized to form a planarized upper surface 62a analogous to the planarized upper surfaces 62 of FIG. 10.

Figure 19:
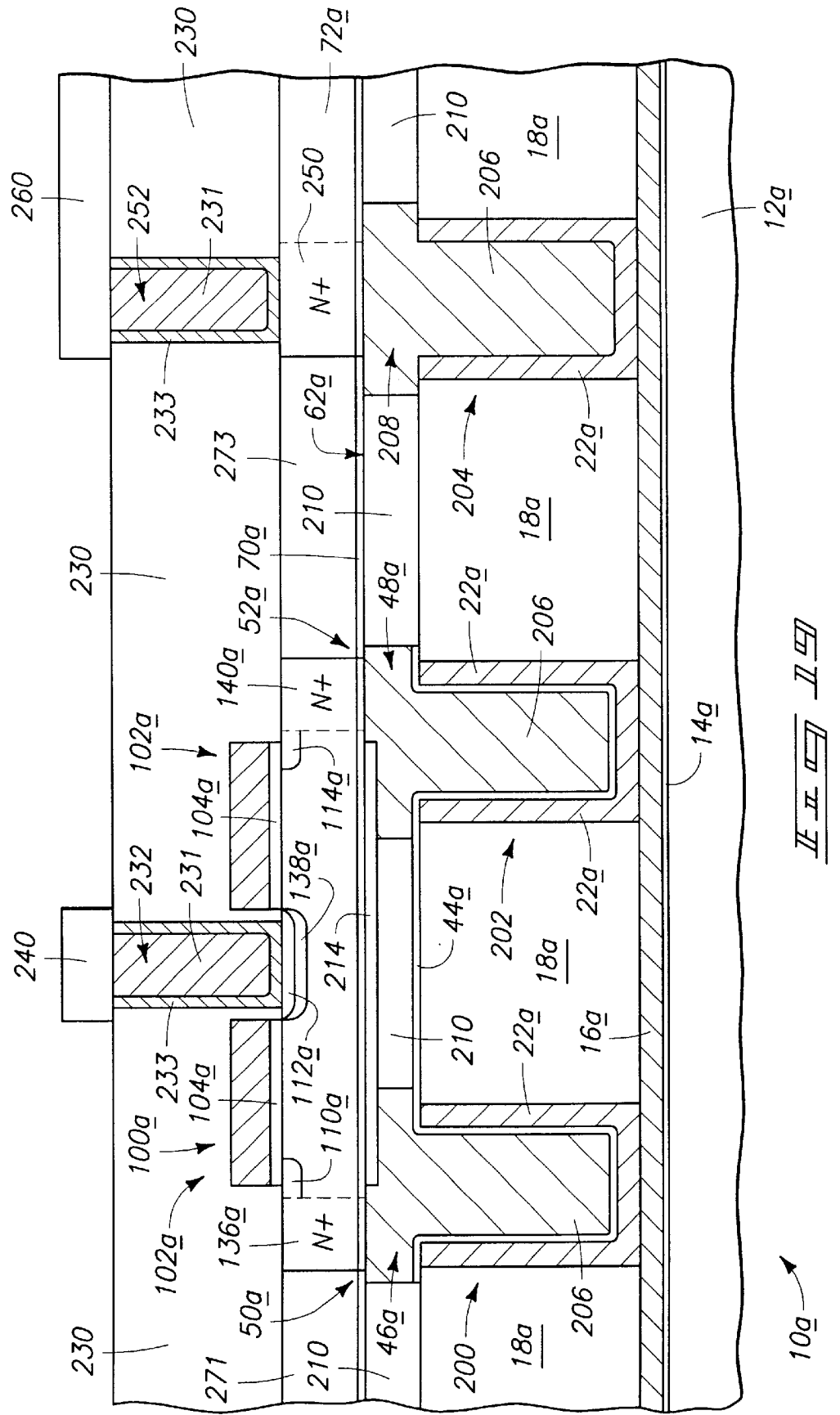
FIG. 19 is a view of the FIG. 13 wafer fragment shown at a processing step subsequent to that of FIG. 18.

Referring to FIG. 19, an amorphous silicon layer 70a is formed over planarized upper surfaces 62a, and a base 72a is bonded over amorphous silicon layer 70a. Subsequently, transistor gates 100a and 102a (shown more schematically than transistor gates 100 and 102 of FIG. 12, but which can comprise the same layers as transistors 100 and 102 of FIG. 12) are formed over base 72a. Source/drain regions 136a, 138a and 140a are formed within base 72a, and lightly doped regions 110a, 112a and 114a are formed adjacent the transistor gates. Sidewall spacers are not shown adjacent transistor gates 100a an 102a, but it is to be understood that spacers similar to the spacers 116 of FIG. 12 could be formed adjacent one or both of gates 100a and 102a. Isolation regions 271 and 273 are also formed within base 72a, with isolation region 271 being adjacent source/drain region 136a, and isolation region 273 being between source/drain region 140a and a conductively doped region 250. Isolation regions 271 and 273 can be formed by, for example, forming trenches within base 72a and filling the trenches with silicon dioxide.

An insulative material 230 is formed over gates 100a and 102a, and a conductive bitline interconnect 232 is formed to extend through insulative material 230 and to source/drain region 138. Conductive interconnect 232 is shown comprising a pair of conductive layers (231 and 233), with an outer layer 233 being, for example, a metal nitride, such as, for example, titanium nitride; and an inner layer 231 being, for example, a metal, such as, for example, tungsten. A bitline 240 is shown formed and patterned over insulative material 230.

Conductively doped region 250 which forms a conductive interconnect through base 72a and to conductive material 208. A contact 252 is shown extending through insulative material 230 and to doped region 250. Contact 252 is shown comprising the conductive materials 231 and 233 described previously with reference to bitline contact 232. Also, an electrical connection 260 is shown formed and patterned over contact 252. Electrical connection 260 is utilized to provide voltage to conductive layer 16a (through conductive materials 252, 250, 208 and 204), and accordingly to power a capacitor plate associated with capacitor structures 50a and 52a.

Another embodiment of the present invention is described with reference to FIGS. 20–24. In describing the embodiment of FIGS. 20–24, similar numbering will be utilized as was used above in describing the embodiment of FIGS. 1–12, with the suffix "b" utilized to indicate structures in FIGS. 20–24.

Figure 20:
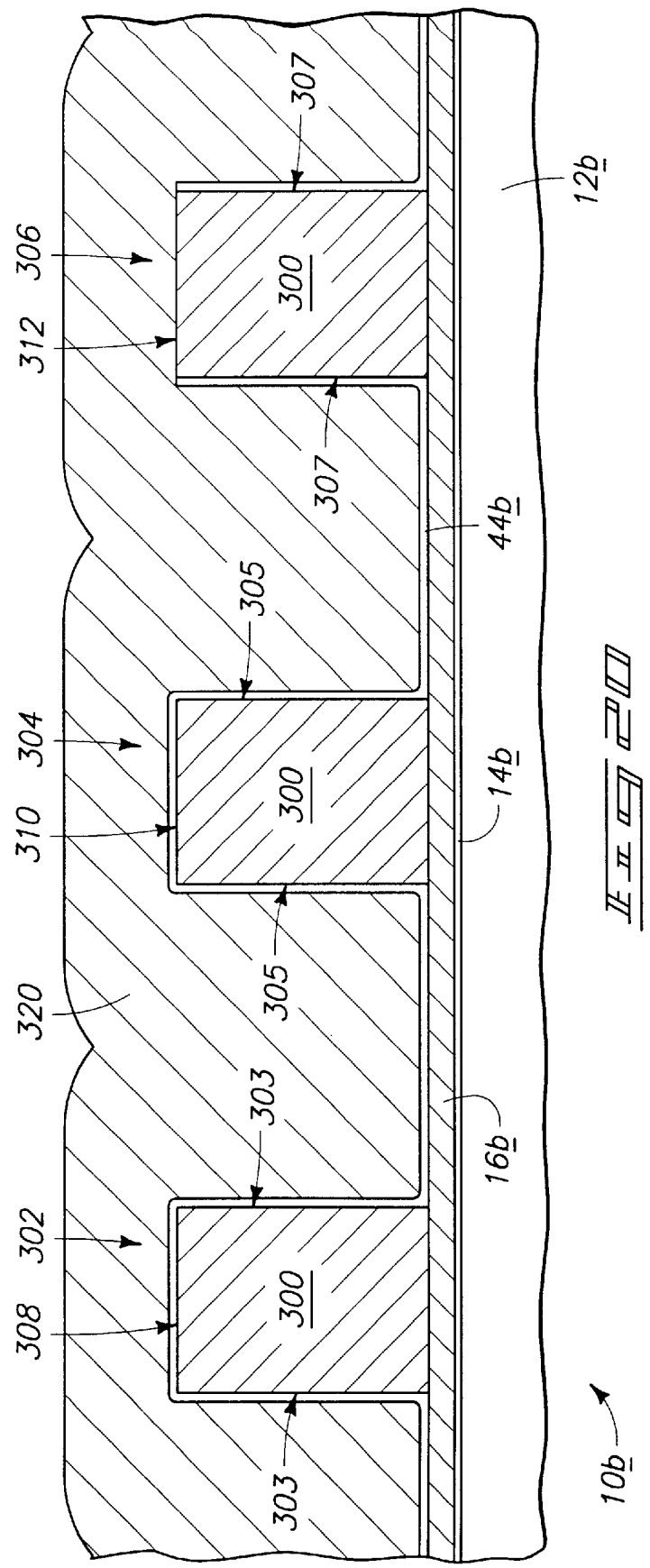
FIG. 20 is a diagrammatic, cross-sectional view of a semiconductor wafer fragment at a preliminary step of a third embodiment method of the present invention.

Referring to FIG. 20, a fragment 10b comprises a base 12b having an insulative layer 14b and a conductive layer 16b formed thereover. Base 12b, insulative layer 14b and conductive layer 16b can comprise the same materials as described above for structures 12, 14 and 16 of FIG. 1.

A second conductive material 300 is formed over and on first conductive material 16b. Second conductive material 300 can comprise the same composition as first conductor material 16b, and specifically can comprise one or more of metal, metal silicide or conductively doped silicon (such as, for example, conductively-doped polysilicon). Conductive material 300 is patterned as pedestals, which form projections 302, 304 and 306 extending from about 1 micron to about 4 microns above an upper surface of conductive material 16b. Material 300 can be patterned into the pedestals 302, 304 and 306 by, for example, forming a layer of material 300 over layer 16b, and subsequently patterning the layer of material 300 by providing a patterned layer of photoresist over the material 300 and transferring a pattern from the photoresist to material 300 with a suitable etch. The photoresist can then be removed to leave patterned structures 302, 304 and 306. Projections 302, 304 and 306 comprise sidewalls 303, 305 and 307, respectively. Further, projections 302, 304 and 306 comprise upper surfaces 308, 310 and 312, respectively.

A dielectric material 44b is formed over projections 302 and 304, and specifically is formed along the sidewalls and over the top surfaces of the projections. Dielectric material 44b can comprise the same compositions as described above for dielectric material 44 of FIG. 6. Dielectric material 44b is patterned such that it extends along sidewalls of projection 306, but does not extend over a top surface of projection 306.

A conductive material 320 is formed over dielectric material 44b.

Figure 21:
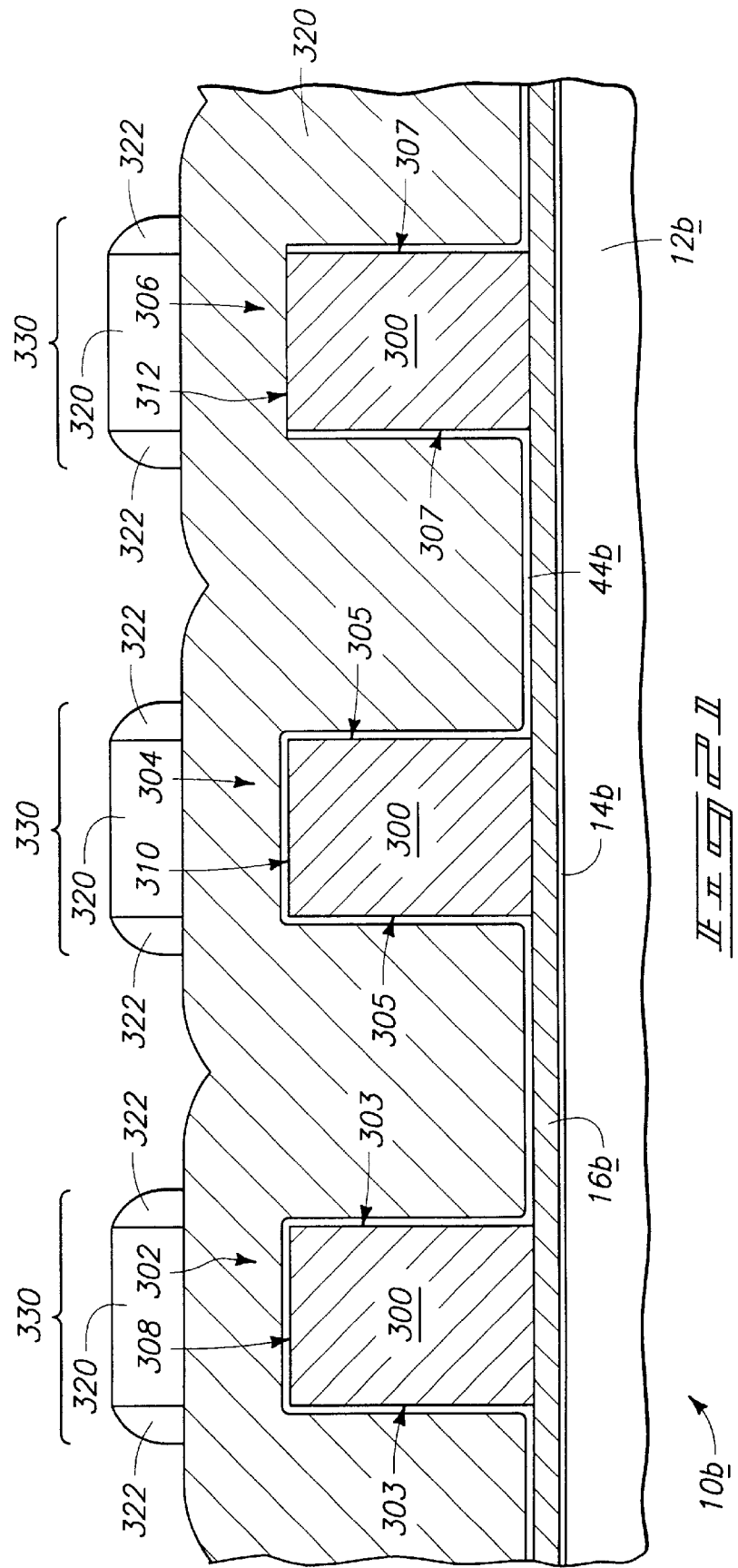
FIG. 21 is a view of the FIG. 20 wafer fragment at a processing step subsequent to that of FIG. 20.

Referring to FIG. 21, masking structures 330 are formed over conductive pedestals 302, 304 and 306. Masking structures 330 comprise inner blocks 320 and sidewall spacers 322 formed along sidewalls of the blocks 320. Blocks 320 and sidewalls spacers 322 preferably both comprise the same material. A suitable material is silicon dioxide. Blocks 320 are preferably formed utilizing a same pattern as was utilized for patterning projections 302, 310 and 312. Accordingly, blocks 320 will have an identical width as projections 302, 304 and 306. Subsequently, spacers 322 are formed alongside the blocks by depositing and anisotropically etching a material. Accordingly, the combination of blocks 320 and spacers 322 forms patterning structures 330 having a width greater than the width of projections 302, 304 and 306.

Figure 22:
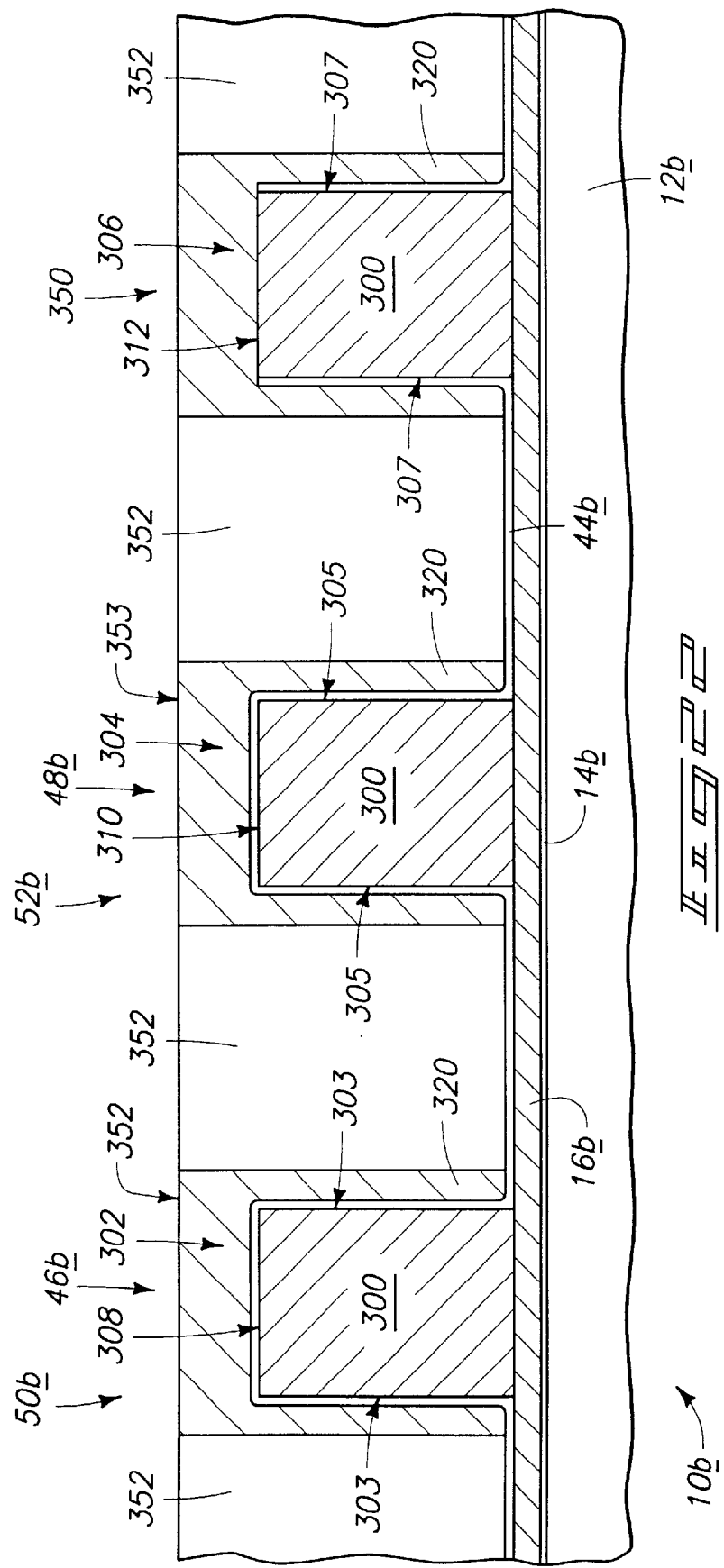
FIG. 22 is a view of the FIG. 20 wafer fragment shown at a processing step subsequent to that of FIG. 21.

Referring to FIG. 22, patterning structures 330 (FIG. 21) are utilized to pattern conductive material 320 into storage node masses 46b and 48b, as well as into a conductive interconnect 350.

Subsequently, an insulative material 352 is formed between structures 46b, 48b and 350. Insulative material 352 can be formed by, for example, depositing an insulative material over and between structures 46b, 48b and 350, and subsequently planarizing the insulative material 352 to remove the insulative material from over structures 46b, 48b and 350. The planarization can comprise, for example, chemical-mechanical polishing, and forms a planarized upper surface 353. It is noted that the planarization can also remove some of conductive material 320 during the formation of planarized upper surface 353.

Structure 46b defines a storage node mass, and together with projection 302 and dielectric material 44b defines a first capacitor structure 50b. Likewise, structure 48b defines a second storage node mass, and together with projection 304 and dielectric material 44b defines a second capacitor structure 52b. Note that conductive material 16b forms a cell plate conductively connected with projections 302b and 304b. Conductive structure 350 forms a conductive interconnect for transferring voltage to the cell plate.

Figure 23:
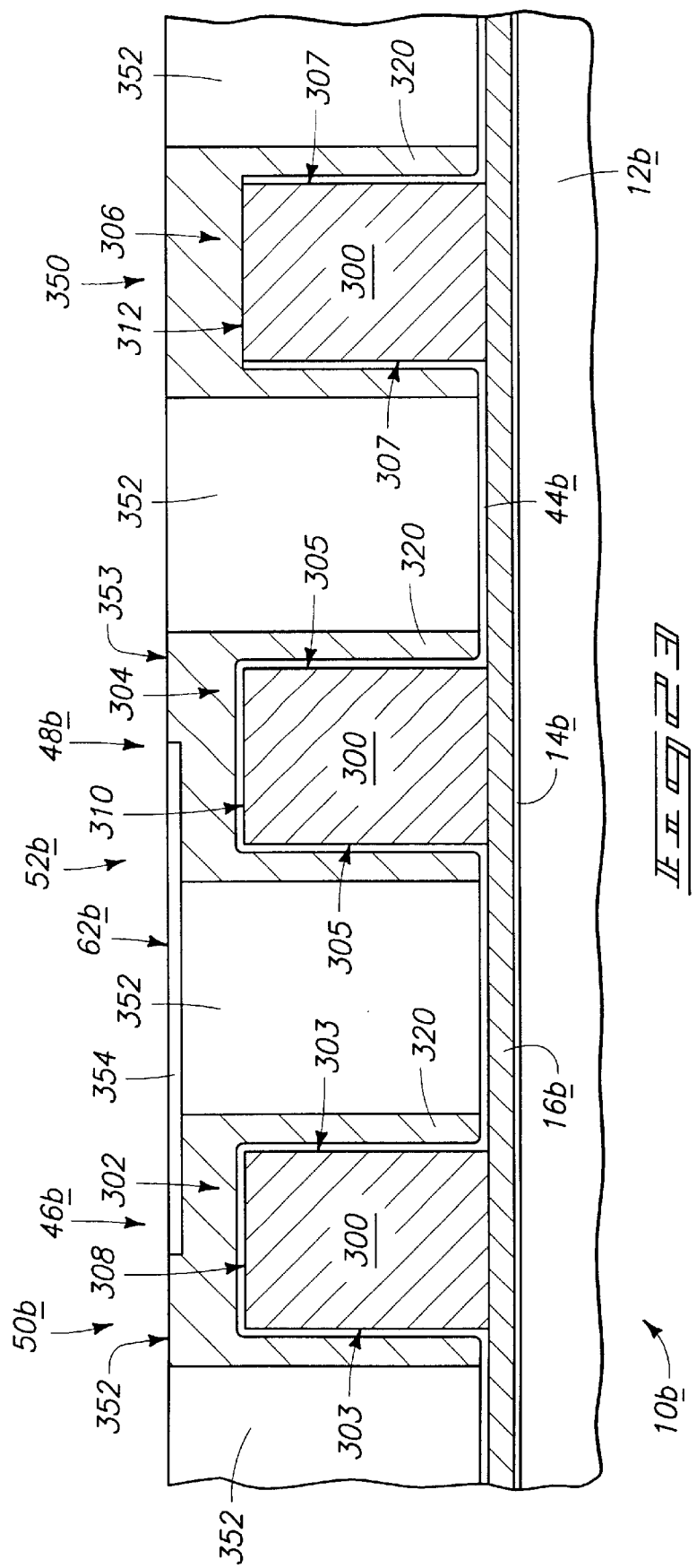
FIG. 23 is a view of the FIG. 20 wafer fragment shown at a processing step subsequent to that of FIG. 22.

Referring to FIG. 23, a dopant barrier layer 354 is formed within and between storage node masses 46b and 48b. Dopant barrier layer 354 can be formed utilizing procedures described above with reference to formation of dopant barrier layer 214 in FIG. 18.

After dopant barrier layer 354 is formed, an upper surface of barrier layer 354 is planarized together with upper surfaces of conductive masses 46b, 48b and 350, as well as an upper surface of insulative material 352, to form a planarized upper surface 62b.

Figure 24:
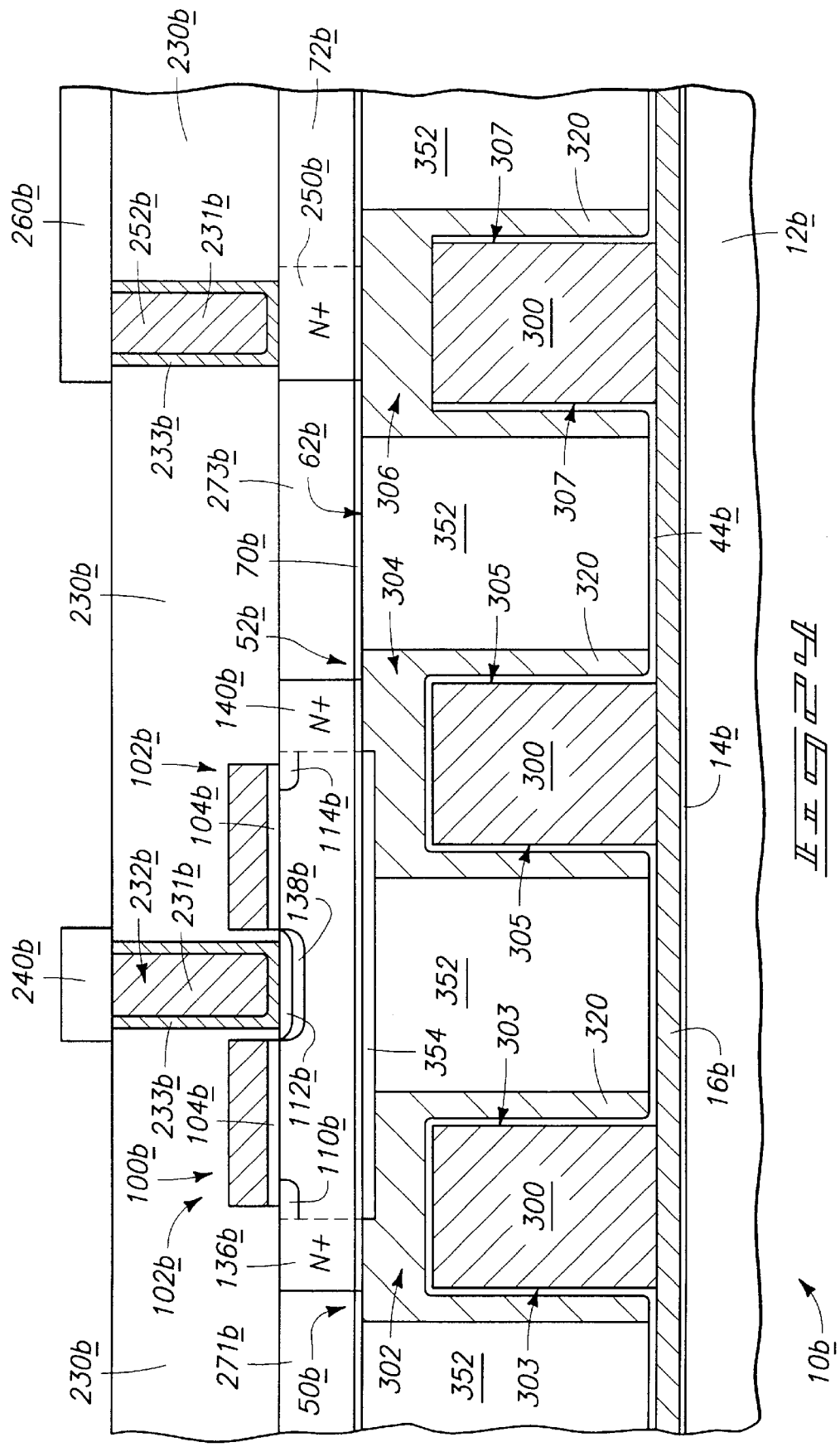
FIG. 24 is a view of the FIG. 20 wafer fragment shown at a processing step subsequent to that of FIG. 23.

Referring to FIG. 24, an amorphous silicon layer 70b is formed over planarized upper surface 62b and subsequently structures analogous to those described with reference to FIG. 19 are formed over amorphous silicon layer 70b. The structures shown in FIG. 24 are labeled analogously to those of FIG. 19, with the suffix "b" utilized to indicate structures shown in FIG. 24.

It is noted that among the advantages of the structures of the present invention relative to prior art devices is that the capacitors of the devices of the present invention (for instance, capacitors 56 and 58 of FIG. 12) can be electrically isolated from a bottom monocrystalline substrate (for instance, 12 of FIG. 12). Thus, there is increased tolerance for defects in the bottom monocrystalline substrate. Additionally, static refresh can remain non-degraded by the storage node junction, and accordingly devices of the present invention can have advantages of SOI, without being conventional SOI structures.

A fourth embodiment method of the present invention is described with reference to FIGS. 25–33. Referring initially to FIG. 25, a semiconductor wafer fragment 500 is shown at an initial processing step. Wafer fragment 500 comprises a substrate 502. Substrate 502 can comprise, for example, a monocrystalline silicon wafer lightly doped with a background p-type dopant. Substrate 502 further comprises a damage region 504 formed therein, and represented by a dashed line. Damage region 504 can be formed by implanting one or more isotopes of hydrogen into substrate 502. Damage region 504 will ultimately be utilized for making a so-called "smart cut" within wafer 502. Damage region 504 can be formed within substrate 502 by, for example, a one time dose with deuterium to form the deuterium to an implant depth of from about 3000 Angstroms to about 10000 Angstroms beneath an upper surface 506 of substrate 502. The deuterium dose can be to from about $3 \times 10^{16}$ atoms/cm$^3$ to about $7 \times 10^{16}$ atoms/cm$^3$.

One aspect of the processing described with reference to this fourth embodiment is that such processing should preferably comprise thermal energies which are sufficiently low that the hydrogen isotopes within damage region 504 are not excessively diffused within substrate 502. Specifically, a total sequence thermal budget preferably remains less or equal to 750° C. for three hours to prevent dispersion of the hydrogen isotopes from the defect layer.

Substrate 502 preferably comprises a low oxygen content, to avoid oxygen precipitation, with a preferable oxygen content being less than 24 ppm.

A nitride layer 510 is formed over substrate 502, and separated from the substrate by an oxide layer 508. Oxide layer 508 is a pad layer that alleviates stress that could otherwise be created by having nitride layer 510 directly on substrate 502. Nitride layer 510 can comprise, for example, $Si_3N_4$, and oxide layer 508 can comprise, for example, $SiO_2$. Nitride layer 510 can function as an etch stop layer in particular processing of the present invention, and accordingly can be referred to as etch stop layer 510.

A photoresist layer 512 is formed over nitride layer 510 and patterned to have openings 514 extending therethrough. Photoresist layer 512 can be patterned by photolithographic patterning. A dopant is implanted through openings 514 and into substrate 502 to form conductively doped diffusion regions 516. The dopant can comprise either n-type dopant or p-type dopant.

Referring to FIG. 26, oxide layer 508 and nitride layer 510 are etched to extend openings 514 to upper surface 506 of substrate 502.

Figure 27:
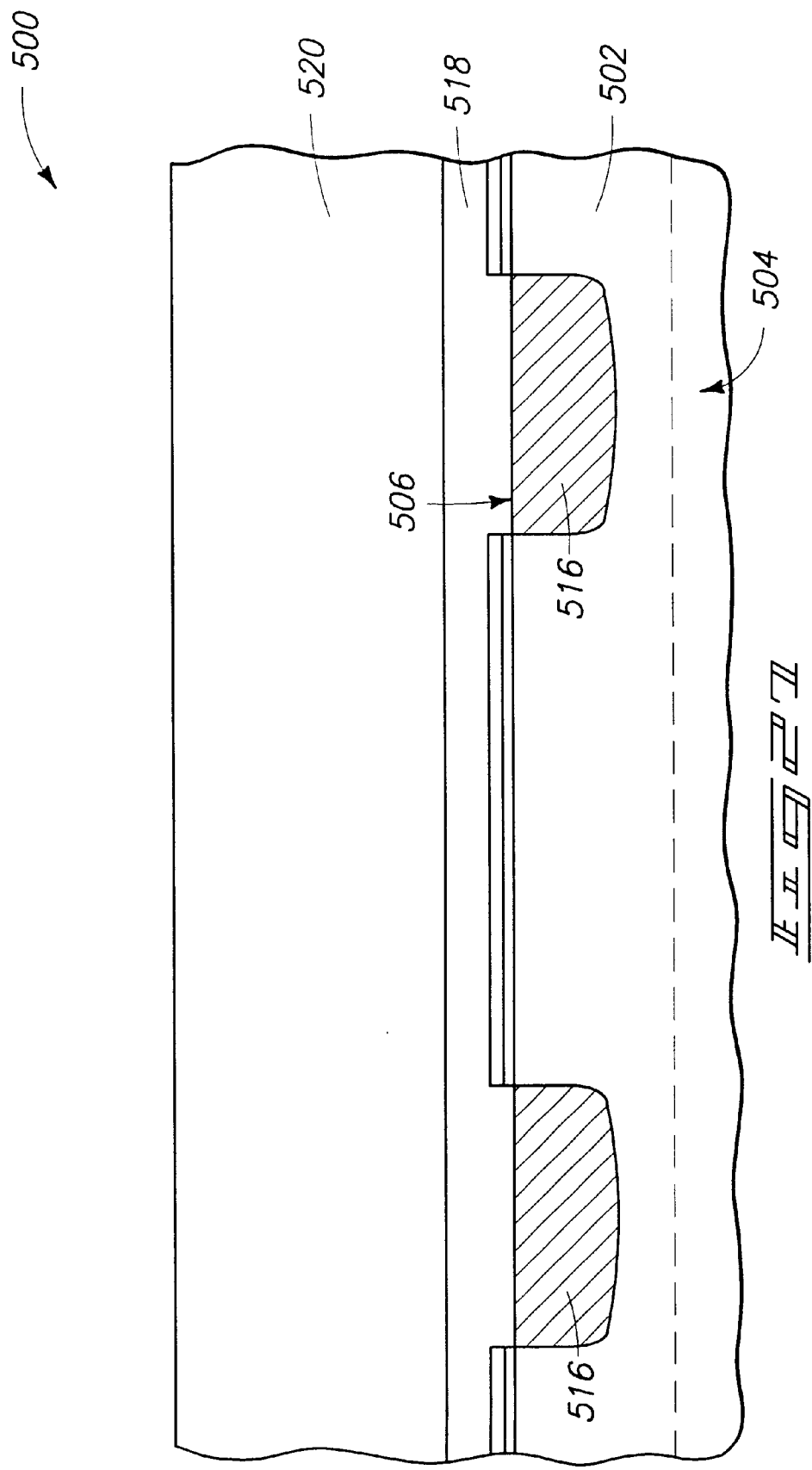
FIG. 27 is a view of the FIG. 25 wafer fragment shown at a processing step subsequent to that of FIG. 26.

Referring to FIG. 27, photoresist 512 (FIG. 26) is removed. Subsequently, an insulative material layer 518 is formed over substrate 502, and a sacrificial layer 520 is formed over layer 518. Layer 518 can comprise, for example, silicon dioxide, and can be formed by, for example, chemical vapor deposition using tetraorthosilicate (TeOS). Sacrificial layer 520 can comprise, for example, borophosphosilicate glass (BPSG).

Figure 28:
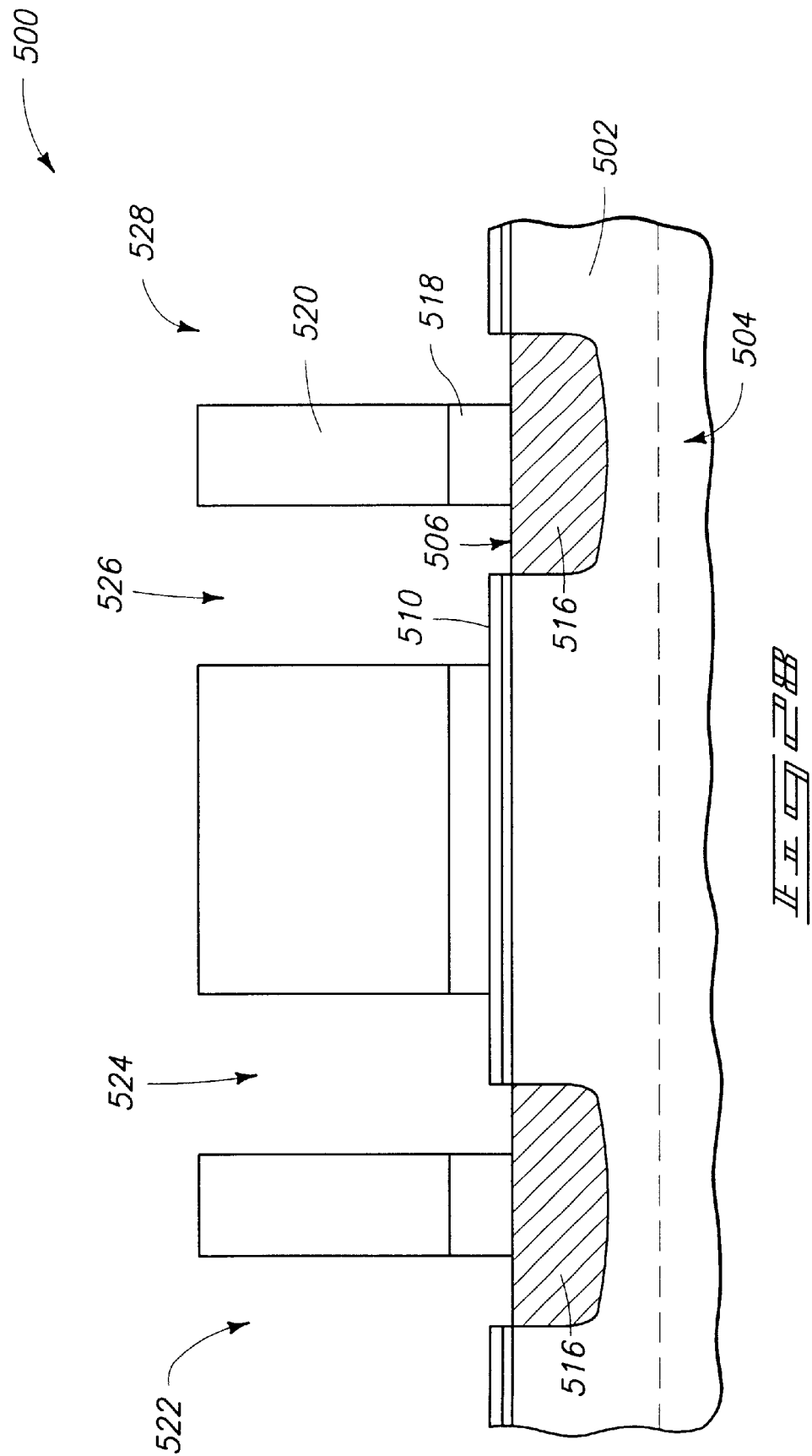
FIG. 28 is a view of the FIG. 25 wafer fragment shown at a processing step subsequent to that of FIG. 27.

Referring to FIG. 28, openings 522, 524, 526 and 528 are etched through layers 518 and 520. Openings 522, 524, 526 and 528 can be formed by, for example, photolithographic processing utilizing photoresist (not shown), and an oxide etch. Openings 522, 524, 526 and 528 extend to upper surface 506 of substrate 502 to contact diffusion regions 516. Openings 522, 524, 526 and 528 also stop on etch stop layer 510. Accordingly, openings 524 and 526 comprise lowermost portions which are narrower than upper portions above the lowermost portions (with the lowermost portions being between layer 510 and 518, as well as between layer 508 and 518; and with the upper portions being between the material 520 one side of an opening and the material 520 on an other side of the opening).

Figure 29:
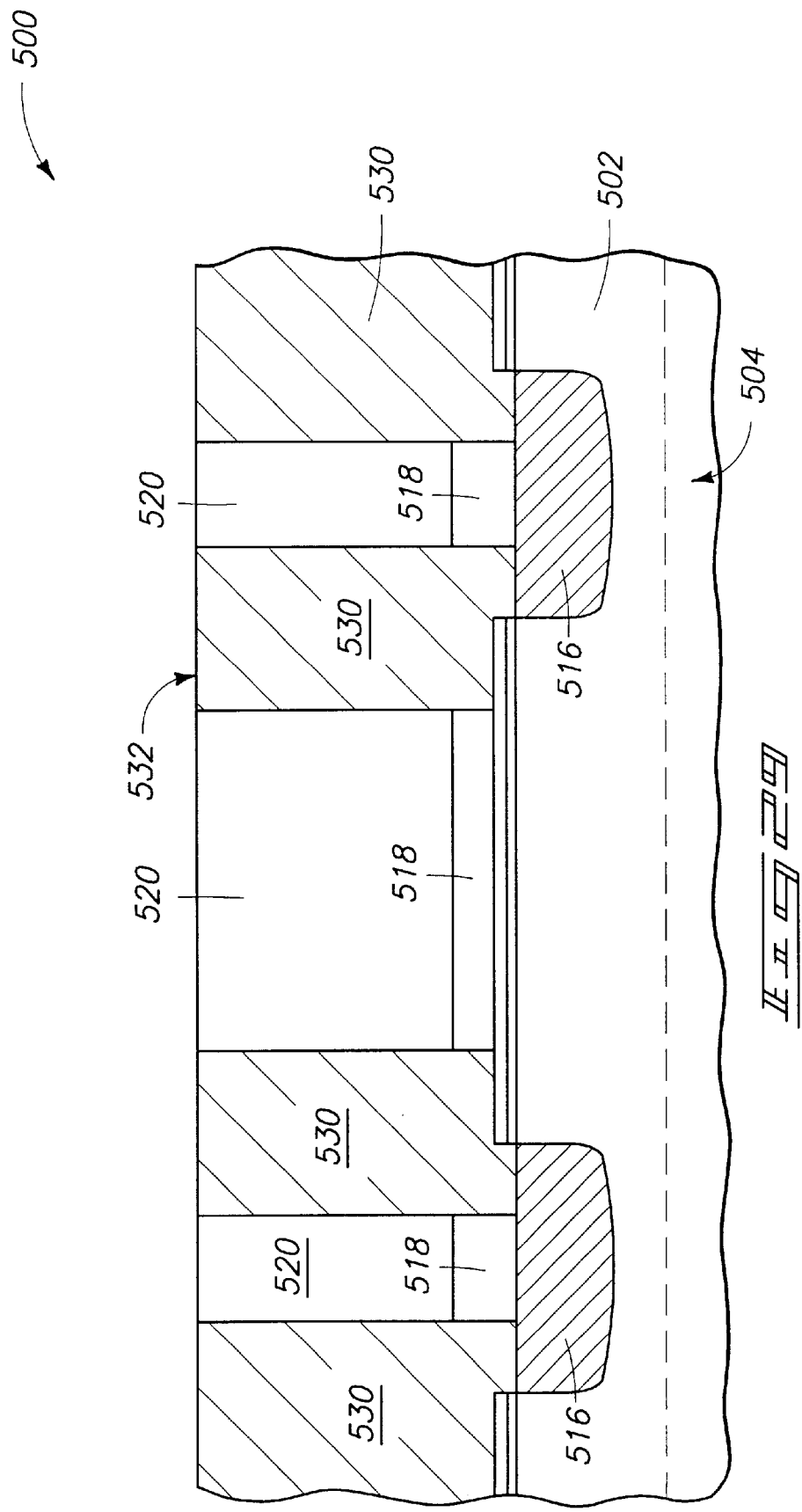
FIG. 29 is a view of the FIG. 25 wafer fragment shown at a processing step subsequent to that of FIG. 28.

Referring to FIG. 29, openings 522, 524, 526 and 528 (FIG. 28) are filled with a first conductive material 530. Material 530 can comprise, for example, conductively doped polysilicon. Material 530 is shown having a planarized upper surface 532. Such planarized upper surface can be formed by, for example, chemical-mechanical polishing.

Referring to FIG. 30, sacrificial material 520 (FIG. 29) is removed from between stacks of conductive material 530 to define openings 534, 536 and 538, and also to define isolated conductive structures 540, 542, 544 and 546. The removal of sacrificial material 520 is shown to leave insulative material 518. Such can be accomplished utilizing, for example, a timed etch which is stopped after material 520 is removed.

Conductive structures 540, 542, 544 and 546 have uppermost surfaces defined by planarized upper surface 532 and have sidewalls exposed within openings 534, 536 and 538.

Referring to FIG. 31, a dielectric material 550 is formed over upper surfaces 532 of conductive structures 540, 542, 544 and 546, as well as along the sidewalls of the conductive structures. Dielectric material 550 an comprise, for example, one or both of silicon dioxide and silicon nitride, and in particular examples can comprise a layer of silicon nitride sandwiched between a pair of silicon dioxide layers (a so-called ONO structure).

A second conductive material 552 is formed over dielectric material 550 and spaced from first conductive material 530 by dielectric material 550. Second conductive material 552 can comprise, for example, conductively doped polysilicon. Material 552 comprises a planarized upper surface 554 which can be formed by, for example, chemical-mechanical polishing.

In the shown embodiment, a conductive interconnect 555 is shown formed to extend through dielectric layer 550, and to connect second conductive material 552 with conductive structure 546. Conductive interconnect 555 can be formed by initially forming an opening 553 extending through layer 550, and subsequently filling opening 553 with conductive material (such as, for example, conductively doped polysilicon).

A silicide layer 556 is shown formed over layer 554, and can enhance electrical conduction across conductive material 552. Silicide 556 can comprise, for example, titanium silicide or tungsten silicide.

An oxide bonding region 558 is shown formed over silicide 556. Oxide bonding region 558 can comprise, for example, silicon dioxide; and specifically can be formed from two combined regions (shown as 560 and 562) that each comprise silicon dioxide.

A second silicon wafer 564 is shown bonded through oxide bonding region 558, and provides a "handle" for manipulating wafer 500 during subsequent processing. The bonding of wafer 564 can be accomplished as follows. Wafer 564 and oxide region 562 can be initially provided as a discrete structure; and oxide region 560 can initially be provided to be associated only with the structures over substrate 502. Subsequently, oxide region 562 can be bonded to oxide region 560 by a process which includes, for example, contacting oxide layers 560 and 562 with one another, and heating the oxide layers to a temperature of about 550° C. for a time of about 30 minutes.

Referring to FIG. 32, wafer 500 is shown in an inverted orientation relative to FIG. 31. The orientation of wafer fragment 500 is inverted so that subsequent devices can be formed on substrate 502. Substrate 502 has been cleaved along defect region 504 (FIG. 31). Such cleavage can occur utilizing, for example, thermal processing. After the cleavage, substrate 502 is planarized to bring an upper surface 570 of the shown fragment 500 down to a level of diffusion regions 516 (the polishing can remove, for example, from 0.3 microns to 0.8 microns of material). Subsequently, trenches are formed within substrate 502 and filled insulative material 572 to define isolation regions extending within diffusion regions 516. The isolation regions defined by insulative material 572 effectively split each of the diffusion regions 516 into two isolated regions. The trenches in diffusion regions 516 can be formed by, for example, masking with pattern photoresist (not shown), and a subsequent etch into substrate 502 to a depth of, for example, about 3000 Å. The trenches can then be filled with insulative material by, for example, chemical vapor depositing silicon dioxide within the trenches. Subsequently, the wafer 500 can be subjected to chemical-mechanical polishing to clear the insulative material from over upper surface 570, as well as to planarize an upper surface of the remaining insulative material 572.

Referring to FIG. 33, a thin oxide layer 580 is formed over surface 570. Oxide layer 580 can comprise, for example, silicon dioxide, and can be formed by chemical vapor deposition.

Wordline structures 582, 584, 586, 588, 590 and 592 are formed over thin oxide layer 580. The wordline structures can comprise, for example, one or more conductive materials such as, for example, polysilicon, metal silicide and metal. An exemplary wordline structure comprises a stack of polysilicon, tungsten silicide and tungsten metal. Also, insulative material caps can be formed on top of the stacks, and sidewall spacers can be formed adjacent the stacks. The wordline structures are shown schematically to simplify the drawing of FIG. 33. The wordline structures can be formed utilizing conventional deposition and patterning methods.

After formation of the wordline structures, a mask (not shown) can be formed over wordline structures 582, 584, 590 and 592, while implanting a dopant adjacent structures 586 and 588 to form lightly doped diffusion regions 600, 602 and 604. Diffusion regions 600, 602 and 604 can also be heavily doped. The dopant utilized for regions 600, 602 and 604 can be n-type or p-type. Lines 586 and 588, together with diffusion regions 600, 602 and 604, define a pair of transistor structures for which the lines comprise transistor gates. Specifically, line 586 gatedly connects regions 600 and 602 to define a transistor structure, and line 588 gatedly connects regions 602 and 604 to define a transistor structure.

An insulative material 606 is formed over oxide layer 580, as well as over the wordlines. Insulative material 606 can comprise, for example, BPSG.

A conductive structure 608 is formed through insulative layer 606 to diffusion region 602. Conductive structure 608 can comprise one or more conductive materials, and in the shown embodiment comprises a first conductive material 610 and a second conductive material 612. First conductive material 610 can comprise, for example, titanium nitride, and second conductive material 612 can comprise, for example, titanium. Conductive structure 608 can be formed within insulative material 606 by, for example, patterning an opening into material 606 and subsequently filling the opening with conductive material. The conductive material can subsequently be subjected to chemical-mechanical polishing to remove the material from over insulative layer 606, as well as to planarize a upper surface of insulative material 606.

After planarization of an upper layer of insulative material 606, a conductive material such as, for example, aluminum metal can be formed across an upper surface of layer 606 to form conductive line 614. The structure shown in FIG. 33 comprises a pair of DRAM structures. Specifically, a transistor gate comprised by line 586 is electrically connected through diffusion region 600 with a capacitor structure 616 defined by conductive structure 544 in combination with dielectric material 550 and second conductive material 552. Also, a transistor gate defined by line 588 is connected through diffusion regions 604 and 516 with a capacitor structure 618 defined by conductive structure 542 in combination with dielectric material 550 and second conductive material 552.

A conductive interconnect 618 is shown in electrical connection with second conductive material 552 through interconnect 555. Conductive interconnect 618 can be formed by, for example, forming an opening through oxide layer 580, and subsequently filling the opening with conductive material. Interconnect 618 can be connected to an electrical source 620 and utilized to provide power to second conductive material 552, and accordingly, to power a capacitor plate defined by material 552.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A DRAM cell, comprising:
 a first monocrystalline silicon substrate;
 an electrically conductive region extending through the first monocrystalline silicon substrate;
 a DRAM capacitor under the first monocrystalline substrate; the DRAM capacitor comprising an electrically conductive storage node electrically connected with the electrically conductive region; the DRAM capacitor comprising a dielectric material and an electrically conductive cell plate spaced from the electrically conductive storage node by at least the dielectric material;
 a second monocrystalline silicon substrate beneath the DRAM capacitor and joined to the electrically conductive cell plate through an oxide bonding region; and
 a DRAM transistor gate over the first monocrystalline silicon substrate; the transistor gate being comprised by a transistor device which includes a source/drain region electrically connected to the DRAM capacitor electrically conductive storage node through the electrically conductive region.

2. A DRAM cell, comprising:
 a capacitor;
 an insulative material over a portion of the capacitor;
 an amorphous silicon layer over the insulative material; and
 a transistor structure over the capacitor, the transistor structure comprising a gate over the insulative material and a source/drain region proximate the gate, the source/drain region being electrically connected with the DRAM capacitor through the amorphous silicon layer.

3. A DRAM cell, comprising:
 a capacitor comprising a storage node, a cell plate, and a dielectric material between the storage node and cell plate;
 a transistor structure over the capacitor and in electrical connection with the capacitor; and
 an electrically conductive path beside the storage node and extending through the dielectric material to the cell plate, the electrically conductive path providing power to the cell plate.

4. A semiconductor structure, comprising:
 a cell plate layer;
 a dielectric material oven the cell plate layer;
 a conductive storage node mass over the dielectric material; the conductive storage node mass, dielectric material and cell plate layer together defining a capacitor structure; a first substrate being defined to encompass the capacitor structure;
 a monocrystalline silicon substrate bonded to the first substrate and over the conductive storage node mass;
 a transistor gate on the monocrystalline silicon substrate and operatively connected with the capacitor structure to define a DRAM cell;
 a silicon-containing layer over the first capacitor structure; and
 wherein the monocrystalline silicon substrate is bonded on the silicon-containing layer.

5. The structure of claim 4 wherein the silicon-containing layer comprises amorphous silicon.

6. The structure of claim 4 wherein the silicon-containing layer consists essentially of amorphous silicon having conductively doped regions extending therethrough.

7. A semiconductor structure, comprising:
 a cell plate layer;
 a dielectric material over the cell plate layer;
 a conductive storage node mass over the dielectric material; the conductive storage node mass, dielectric material and cell plate layer together defining a capacitor structure; a first substrate being defined to encompass the capacitor structure;
 a monocrystalline silicon substrate bonded to the first substrate and over the conductive storage node mass;
 a transistor gate on the monocrystalline silicon substrate and operatively connected with the capacitor structure to define a DRAM cell; and
 wherein the cell plate layer comprises:
  a conductive material layer over an insulative material base; and
  at least one conductive projection extending upwardly from the conductive material layer.

8. The structure of claim 7 wherein the at least one conductive projection comprises a different conductive material than the conductive material layer.

9. A semiconductor structure, comprising:
 a cell plate layer;
 a dielectric material over the cell plate layer;
 a conductive storage node mass over the dielectric material; the conductive storage node mass, dielectric material and cell plate layer together defining a capacitor structure; a first substrate being defined to encompass the capacitor structure;

a monocrystalline silicon substrate bonded to the first substrate and over the conductive storage node mass;

a transistor gate on the monocrystalline silicon substrate and operatively connected with the capacitor structure to define a DRAM cell;

wherein the cell plate layer comprises:

a first conductive material layer over an insulative material base;

a second conductive material over the first conductive material and defining a conductive projection extending upwardly from the first conductive material layer, the conductive projection comprising a top surface and sidewall surfaces extending from the first conductive material layer to the top surface;

wherein the dielectric material extends over the top surface and along the sidewall surfaces of the conductive projection; and wherein the conductive storage node mass extends over the top surface and along the sidewall surfaces of the conductive projection.

* * * * *

UNITED STATES PATENT AND TRADEMARK OFFICE
CERTIFICATE OF CORRECTION

PATENT NO.     : 6,639,243 B2
DATED          : October 28, 2003
INVENTOR(S)    : Gonzalez et al.

It is certified that error appears in the above-identified patent and that said Letters Patent is hereby corrected as shown below:

Column 6,
Line 25, replace "521" with -- Å --.

Column 9,
Line 63, replace "an" with -- and --.

Column 13,
Line 27, replace "an" with -- can --.

Signed and Sealed this

Sixth Day of July, 2004

JON W. DUDAS
*Acting Director of the United States Patent and Trademark Office*